(12) United States Patent
Aoyama et al.

(10) Patent No.: US 9,444,051 B2
(45) Date of Patent: Sep. 13, 2016

(54) METHOD OF MANUFACTURING LIGHT-EMITTING DEVICE, AND EVAPORATION DONOR SUBSTRATE

(75) Inventors: Tomoya Aoyama, Kanagawa (JP); Yosuke Sato, Kanagawa (JP); Kohei Yokoyama, Kanagawa (JP); Rena Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 814 days.

(21) Appl. No.: 13/442,133

(22) Filed: Apr. 9, 2012

(65) Prior Publication Data

US 2012/0251772 A1 Oct. 4, 2012

Related U.S. Application Data

(62) Division of application No. 12/254,966, filed on Oct. 21, 2008, now Pat. No. 8,153,201.

(30) Foreign Application Priority Data

Oct. 23, 2007 (JP) .................................. 2007-275066

(51) Int. Cl.
*H01L 51/00* (2006.01)
*B41M 5/382* (2006.01)
(Continued)

(52) U.S. Cl.
CPC .......... *H01L 51/0013* (2013.01); *B41M 5/382* (2013.01); *B41M 5/38242* (2013.01); *C23C 14/048* (2013.01); *H01L 51/007* (2013.01); *H01L 51/0037* (2013.01); *H01L 51/0052* (2013.01); *H01L 51/0059* (2013.01);
(Continued)

(58) Field of Classification Search
CPC .......................... H01L 51/0013; B41M 5/382
See application file for complete search history.

(56) References Cited

U.S. PATENT DOCUMENTS

| 4,923,860 A | 5/1990 | Simons |
| 5,851,709 A | 12/1998 | Grande et al. |

(Continued)

FOREIGN PATENT DOCUMENTS

| EP | 0 913 870 A2 | 5/1999 |
| EP | 1 650 046 A1 | 4/2006 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, 2007, pp. 161-164.

*Primary Examiner* — Francisco Tschen
(74) *Attorney, Agent, or Firm* — Husch Blackwell LLP

(57) ABSTRACT

The present invention relates to a donor substrate and a method of manufacturing a light-emitting device. The donor substrate includes a reflective layer including an opening portion, a light absorption layer covering the opening portion of the reflective layer over the reflective layer, a heat insulating layer including an opening portion in a position overlapped with the opening portion of the reflective layer over the light absorption layer, and a material layer including a light-emitting material covering the opening portion of the heat insulating layer over the heat insulating layer. A target substrate and the donor substrate are disposed to face each other, and an EL layer is formed over the target substrate by performing light irradiation from a rear surface of the donor substrate.

31 Claims, 20 Drawing Sheets

(51) Int. Cl.
*C23C 14/04* (2006.01)
*H01L 51/50* (2006.01)

(52) U.S. Cl.
CPC ...... *H01L 51/0078* (2013.01); *H01L 51/5012* (2013.01); *H01L 51/5048* (2013.01); *H01L 51/5088* (2013.01); *Y10T 428/24331* (2015.01); *Y10T 428/31504* (2015.04)

(56) References Cited

U.S. PATENT DOCUMENTS

| | | | |
|---|---|---|---|
| 5,937,272 A | 8/1999 | Tang | |
| 5,994,028 A | 11/1999 | Lee | |
| 6,165,543 A | 12/2000 | Otsuki et al. | |
| 6,283,060 B1 | 9/2001 | Yamazaki et al. | |
| 6,284,307 B1 | 9/2001 | Fukuzawa et al. | |
| 6,689,492 B1 | 2/2004 | Yamazaki et al. | |
| 6,703,179 B2 | 3/2004 | Tyan | |
| 6,776,847 B2 | 8/2004 | Yamazaki et al. | |
| 7,316,983 B2 | 1/2008 | Yamazaki et al. | |
| 7,674,749 B2 | 3/2010 | Kang et al. | |
| 7,932,112 B2 | 4/2011 | Yokoyama et al. | |
| 7,993,945 B2 | 8/2011 | Ikeda et al. | |
| 2001/0000744 A1* | 5/2001 | Wolk et al. | 430/200 |
| 2004/0065902 A1 | 4/2004 | Yamazaki et al. | |
| 2005/0005848 A1 | 1/2005 | Yamazaki et al. | |
| 2005/0145326 A1 | 7/2005 | Hatwar | |
| 2006/0243377 A1 | 11/2006 | Matsuo et al. | |
| 2006/0246240 A1 | 11/2006 | Matsuda et al. | |
| 2008/0081115 A1 | 4/2008 | Yamazaki et al. | |
| 2009/0075214 A1 | 3/2009 | Hirakata et al. | |
| 2009/0104403 A1 | 4/2009 | Aoyama et al. | |
| 2009/0197017 A1 | 8/2009 | Tanaka et al. | |

FOREIGN PATENT DOCUMENTS

| | | |
|---|---|---|
| EP | 1 787 822 A2 | 5/2007 |
| JP | 11-237504 | 8/1999 |
| JP | 2000-256877 | 9/2000 |
| JP | 2003-313654 | 11/2003 |
| JP | 2004-103406 | 4/2004 |
| JP | 2006-123546 | 5/2006 |
| JP | 2006-309995 | 11/2006 |
| JP | 2006-344459 | 12/2006 |
| JP | 2008-066147 A | 3/2008 |
| WO | WO 2005/069398 A2 | 7/2005 |

* cited by examiner

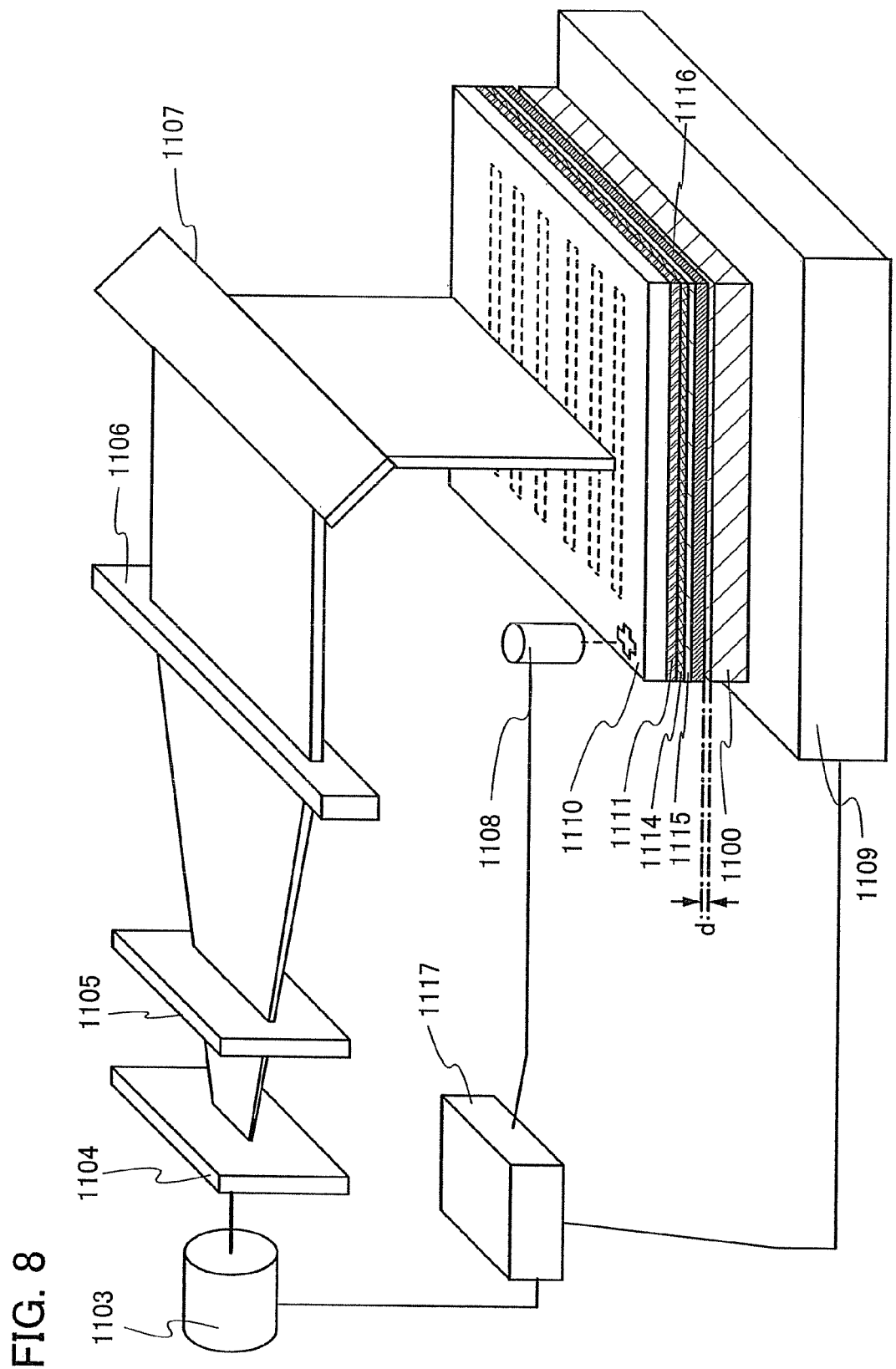

METHOD OF MANUFACTURING LIGHT-EMITTING DEVICE, AND EVAPORATION DONOR SUBSTRATE

This application is a divisional of application Ser. No. 12/254,966 filed Oct. 21, 2008 now U.S. Pat. No. 8,153,201.

BACKGROUND OF THE INVENTION

1. Field of the Invention

The present invention relates to a light-emitting device and a method of manufacturing the light-emitting device. The present invention also relates to an evaporation donor substrate used for deposition of a material which can be deposited onto a substrate.

2. Description of the Related Art

Organic compounds can take various structures compared with inorganic compounds, and it is possible to synthesize materials having various functions by appropriate molecular design. Owing to these advantages, photo electronics and electronics which utilize functional organic materials have been attracting attention in recent years.

A solar cell, a light-emitting element, an organic transistor, and the like are given as examples of electronics devices using an organic compound as a functional organic material. These devices take advantage of electrical properties and optical properties of the organic compound. Among them, in particular, a light-emitting element has been making remarkable progress.

It is said that light-emitting elements have a mechanism of light emission as follows: by applying voltage between a pair of electrodes with an electroluminescence (hereinafter also referred to as EL) layer interposed therebetween, electrons injected from a cathode and holes injected from an anode recombine with each other in an emission center of the EL layer to form molecular excitons, and energy is released when the molecular excitons relax to the ground state; accordingly light is emitted. As excited states, a singlet excited state and a triplet excited state are known, and light emission is considered to be possible through either of these excited states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

In addition, EL materials for Miming EL layers are broadly classified into a low molecular (monomer) material and a high molecular (polymer) material. In general, a low molecular material is often deposited using an evaporation apparatus and a high molecular material using an inkjet method or the like. A conventional evaporation apparatus, in which a substrate is mounted in a substrate holder, has a crucible (or an evaporation boat) containing an EL material, that is, an evaporation material, a heater for heating the EL material in the crucible, and a shutter for preventing the subliming EL material from being scattered. Then, the EL material heated by the heater is sublimed to be deposited onto the substrate. At this time, in order to achieve uniform deposition, a deposition target substrate needs to be rotated, and further the distance between the substrate and the crucible needs to be about 1 m even for a 300 mm by 360 mm substrate.

In the case of considering manufacturing a full-color flat panel display using emission colors of red, green, and blue by the above method, a metal mask is provided between the substrate and an evaporation source so as to be in contact with the substrate, so that selective coloring can be achieved using this mask. However, this method does not provide very high-precision deposition and thus requires that the distance between pixels be designed to be large and that the width of a partition wall (a bank) formed of an insulator between pixels be large. Therefore, application of the method to a high-definition display device is difficult.

In addition, demands for more definition, higher aperture ratio, and higher reliability of a full-color flat panel display using emission colors of red, green, and blue have been increasing. Such demands are major issues in advancing miniaturization of each display pixel pitch, which is associated with improvement in definition (an increase in the number of pixels) and a reduction in size of a light-emitting device. At the same time, demands for more productivity and lower cost have also been increasing.

Thus, a method of forming an EL layer of a light-emitting element by laser thermal transfer has been proposed (see Reference 1: Japanese Published Patent Application No. 2006-309995). Reference 1 discloses a transfer substrate which has a photothermal conversion layer including a low-reflective layer and a high-reflective layer and also a transfer layer over a supporting substrate. Irradiation of such a transfer substrate with laser light (also refereed to as laser beam) allows the transfer layer over the low-reflective layer to be transferred to an element-forming substrate.

SUMMARY OF THE INVENTION

However, in a conventional transfer substrate having a photothermal conversion layer, heat converted from light in the photothermal conversion layer is conducted not only in the thickness direction but also in the plane direction of the photothermal conversion layer. There is a problem in that a region in the transfer layer, which is to be transferred, increases if heat is conducted in the plane direction of the photothermal conversion layer. In addition, even in a photothermal conversion layer formed of a high reflective layer and a low reflective layer, a certain amount of heat is considered to be absorbed also in the high reflective layer, and thus when the energy power of irradiation laser light is large, not only a portion of the transfer layer over the low reflective layer but also a portion of the transfer layer over the high reflective layer may be transferred.

In view of the foregoing problems, the present invention provides a method of manufacturing a light-emitting device and an evaporation donor substrate, by which the precision of patterning of an EL layer of each color can be improved in manufacture of a full color flat panel display using emission colors of red, green, and blue.

An aspect of the present invention is a method of manufacturing a light-emitting device, which includes the steps of disposing a second substrate and a first substrate including a reflective layer including an opening portion, a heat insulating layer including an opening portion in a position overlapped with the opening portion of the reflective layer over the reflective layer, a light absorption layer covering the opening portion of the reflective layer and the opening portion of the heat insulating layer over the heat insulating layer, and a material layer over the light absorption layer, so that one surface of the first substrate faces a deposition target surface of the second substrate; performing light irradiation from the other surface side of the first substrate; and forming an EL layer in a region overlapped with the opening portion of the reflective layer and the opening portion of the heat insulating layer on the deposition target surface of the second substrate.

Further, an aspect of the present invention is a method of manufacturing a light-emitting device, which includes the steps of disposing a second substrate and a first substrate including a reflective layer including an opening portion, a light absorption layer covering the opening portion of the reflective layer over the reflective layer, a heat insulating layer including an opening portion in a position overlapped with the opening portion of the reflective layer over the light absorption layer, and a material layer covering the opening portion of the heat insulating layer over the heat insulating layer, so that one surface of the first substrate faces a deposition target surface of the second substrate; performing light irradiation from the other surface side of the first substrate; and forming an EL layer in a region overlapped with the opening portion of the reflective layer and the opening portion of the heat insulating layer on the deposition target surface of the second substrate.

In addition, in the above method of manufacturing a light-emitting device of the present invention, the heat insulating layer is formed of a material having lower heat conductivity than the light absorption layer and the reflective layer, thereby suppressing heating of a portion of the material layer in a region overlapped with the reflective layer.

In addition, in the above method of manufacturing a light-emitting device of the present invention, the second substrate provided with a first electrode is used as the second substrate onto which an evaporation material is evaporated, and after the evaporation material is attached to the first electrode of the second substrate, the second substrate may be provided with a second electrode.

An aspect of the present invention is an evaporation donor substrate which includes, on a surface of a substrate, a reflective layer including an opening portion; a heat insulating layer including an opening portion in a position overlapped with the opening portion of the reflective layer over the reflective layer; a light absorption layer covering the opening portion of the reflective layer and the opening portion of the heat insulating layer over the heat insulating layer; and a material layer over the light absorption layer.

Further, an aspect of the present invention is an evaporation donor substrate which includes, on a surface of a substrate, a reflective layer including an opening portion; a light absorption layer covering the opening portion of the reflective layer over the reflective layer; a heat insulating layer including an opening portion in a position overlapped with the opening portion of the reflective layer over the light absorption layer; and a material layer covering the opening portion of the heat insulating layer over the heat insulating layer.

In addition, in the above evaporation donor substrate of the present invention, the heat insulating layer is formed of a material having lower heat conductivity than the reflective layer and the light absorption layer.

Note that in this specification, one surface where a reflective layer, a light absorption layer, and a heat insulating layer are formed is referred to as a surface of a substrate, and also the other surface opposite to the one surface of the substrate is referred to as a rear surface of the substrate.

Application of the present invention makes it easy to form a layer containing an evaporation material for forming a light-emitting element and to manufacture a light-emitting device including the light-emitting element.

In addition, application of the present invention makes it possible to form a film containing an evaporation material into a desired shape with high precision. Accordingly, the present invention can advance miniaturization of each display pixel pitch associated with an improvement in definition (an increase in the number of pixels) and a reduction in the size of a light-emitting device.

BRIEF DESCRIPTION OF THE DRAWINGS

FIG. 8 illustrates an example of a deposition apparatus.

DETAILED DESCRIPTION OF THE INVENTION

Figure 1A:
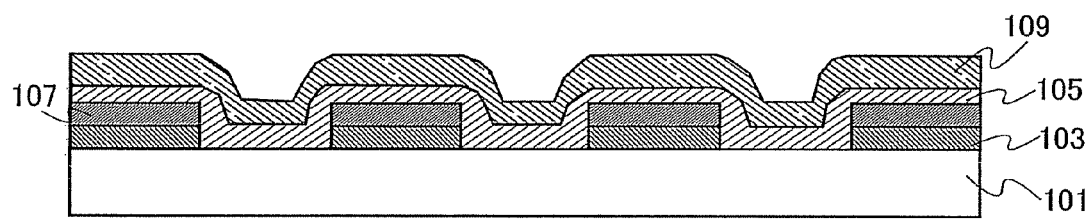
FIGS. 1A to 1C are schematic views each illustrating a cross section in a deposition process according to an aspect of the present invention.

Hereinafter, embodiment modes and embodiments of the present invention are described using the accompanying drawings. Note that the present invention is not limited to the description below and it is easily understood by those skilled in the art that a variety of changes can be made in forms and details without departing from the spirit and the scope of the present invention. Therefore, the present invention is not construed as being limited to the description of the embodiment modes and embodiments given below. Note that in the structure of the present invention described below, the same reference numerals may be used to denote the same components among the different drawings.

Embodiment Mode 1

Figure 1B:
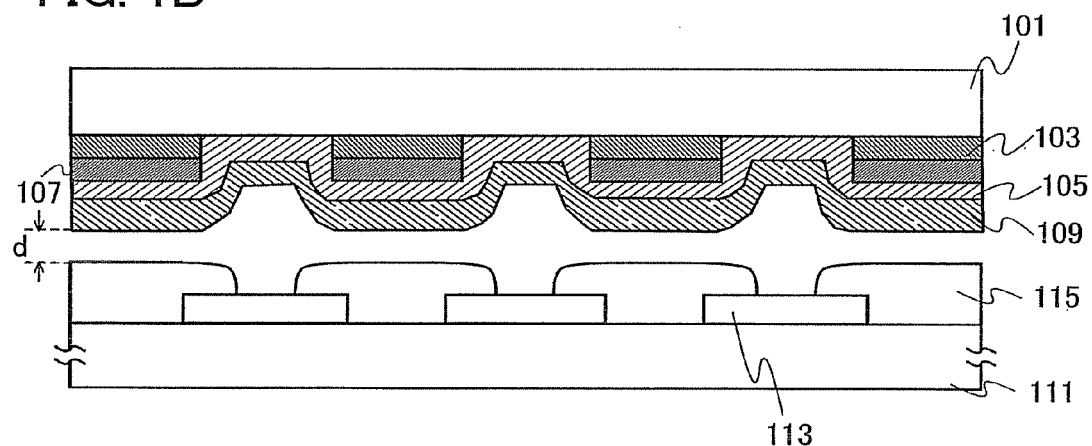
Figure 1C:
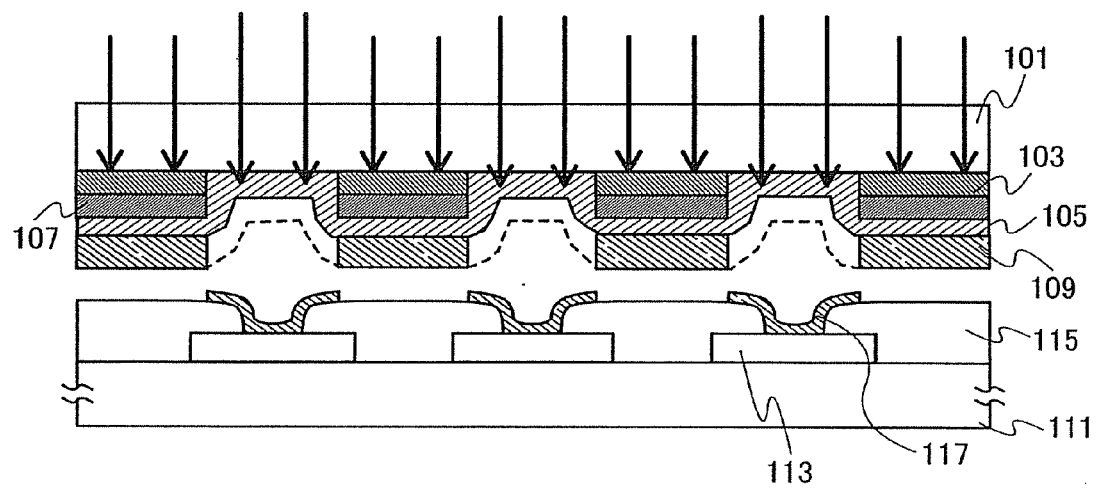

An evaporation donor substrate and a manufacturing method of a light-emitting device of the present invention are described using FIGS. 1A to 1C.

FIG. 1A shows one example of an evaporation donor substrate of the present invention. In FIG. 1A, a reflective layer 103 is formed over a first substrate 101 which is a supporting substrate. The reflective layer 103 includes an opening portion. In addition, a heat insulating layer 107 is formed over the reflective layer 103 and includes an opening portion in a region overlapped with the opening portion included in the reflective layer 103. In addition, a light absorption layer 105 is formed over the heat insulating layer 107. In FIGS. 1A to 1C, the light absorption layer 105 is formed so as to cover the entire surface of the first substrate 101. In addition, over the light absorption layer 105, a material layer 109 containing an evaporation material is formed.

Note that in this specification, "overlapped with" means not only the case where components included in an evaporation donor substrate (e.g., a reflective layer and a light absorption layer) are overlapped with each other while in direct contact with each other, but also the case where the components are overlapped with each other with another layer interposed therebetween.

A method of manufacturing an evaporation donor substrate of the present invention, which is shown in FIG. 1A, and a method of manufacturing a light-emitting device using the evaporation donor substrate are described.

First, after the reflective layer 103 is deposited onto the first substrate 101, the opening portion is formed in the reflective layer. The first substrate 101 is the supporting substrate for the reflective layer, the light absorption layer, the heat insulating layer, and the like, and transmits irradiation light used for evaporating the material layer onto a deposition target substrate in a manufacturing process of a light-emitting device. Therefore, the first substrate 101 preferably has high light transmittance. Specifically, when lamp light or laser light is used in order to evaporate the material layer, a substrate that transmits the light is preferably used as the first substrate 101. As the first substrate 101, for example, a glass substrate, a quartz substrate, a plastic substrate containing an inorganic material, or the like can be used.

In a manufacturing process of a light-emitting device, the reflective layer 103 reflects light with which the first substrate is irradiated to shield a portion of the material layer 109, which is formed in a region overlapped with the reflective layer 103, so that heat that enables sublimation is not conducted to this portion. The reflective layer is preferably formed of a material having a reflectance of 85% or more, more preferably, a reflectance of 90% or more for the irradiation light. For example, when light in the infrared region at a wavelength of 800 to 2500 nm is irradiated, aluminum, silver, gold, platinum, copper, an alloy containing aluminum, an alloy containing silver, or the like can be used as a material of the reflective layer. In particular, an aluminum-titanium alloy, an aluminum-neodymium alloy, or a silver-neodymium alloy has high reflectance for light in the infrared region (at a wavelength of 800 nm or more) and is thus suitably used for the reflective layer. For example, in the case of having a thickness of 400 nm, an aluminum-titanium alloy film exhibits a reflectance of 85% or more for light throughout the infrared region (at a wavelength greater than or equal to 800 nm and less than or equal to 2500 nm) and in particular, a reflectance of 90% or more for light in the region at a wavelength greater than or equal to 900 nm and less than or equal to 2500 nm. Note that the kind of suitable material for the reflective layer 103 varies depending on the wavelength of light with which the first substrate 101 is irradiated. In addition, the reflective layer is not limited to a single layer and may include a plurality of layers.

The reflective layer 103 can be formed by any of various kinds of methods. For example, the reflective layer 103 can be formed by a sputtering method, an electron beam evaporation method, a vacuum evaporation method, or the like. In addition, the thickness of the reflective layer is preferably about greater than or equal to 100 nm and less than or equal to 2 μm although it depends on a material. A thickness greater than or equal to 100 nm can suppress transmission of irradiation light through the reflective layer.

In addition, although any of various kinds of methods can be employed for forming the opening portion in the reflective layer 103, use of dry etching is preferable. By use of dry etching, the opening portion has a sharper sidewall, and thus a fine pattern can be formed.

In this embodiment mode, an aluminum film having a thickness greater than or equal to 100 nm and less than or equal to 500 nm is formed as the reflective layer 103. In the case of having a thickness greater than or equal to 100 nm and less than or equal to 500 nm, an aluminum film exhibits a reflectance of 85% or more throughout the infrared region (at a wavelength greater than or equal to 800 nm and less than or equal to 2500 nm) and in particular, a reflectance of 90% or more for light in the region at a wavelength greater than or equal to 900 nm and less than or equal to 2500 nm. In addition, an aluminum film having a thickness greater than or equal to 100 nm and less than or equal to 500 nm has a transmittance of 0% for light in the infrared region (at a wavelength greater than or equal to 800 nm and less than or equal to 2500 nm) and therefore can be preferably used for the reflective layer.

Next, the heat insulating layer 107 is formed over the reflective layer 103. In a manufacturing process of a light-emitting device, the heat insulating layer 107 suppresses heating and sublimation of the portion of the material layer 109, which is located in the region overlapped with the reflective layer 103. For the heat insulating layer 107, for example, titanium oxide, silicon oxide, silicon oxynitride, zirconium oxide, titanium carbide, or the like can be preferably used. Note that for the heat insulating layer 107, a material having lower heat conductivity than materials used for the reflective layer 103 and the light absorption layer 105 is used. Note that in this specification, "oxynitride" refers to a substance that contains more oxygen than nitrogen.

The heat insulating layer 107 can be formed by any of various kinds of methods. For example, the heat insulating layer 107 can be formed by a sputtering method, an electron beam evaporation method, a vacuum evaporation method, a CVD method, or the like. In addition, the thickness of the heat insulating layer can be set to be greater than or equal to 10 nm and less than or equal to 2 μm, preferably, greater than or equal to 100 nm and less than or equal to 600 nm although it depends on a material. By setting the thickness of the heat insulating layer 107 to be greater than or equal to 10 nm and less than or equal to 2 μm, an effect of blocking heat conduction to the portion of the material layer, which is located over the reflective layer 103, can be obtained even when the reflective layer 103 is heated.

In addition, the heat insulating layer 107 includes an opening portion in the region overlapped with the opening portion in the reflective layer 103. Although any of various kinds of methods can be employed for forming a pattern of the heat insulating layer 107, use of dry etching is preferable. By use of dry etching, the patterned heat insulating layer 107 has a sharper sidewall and thus a fine pattern can be formed.

Note that preferably, the heat insulating layer 107 and the reflective layer 103 are patterned in one-time etching process, and accordingly the sidewalls of the opening portions provided in the heat insulating layer 107 and the reflective layer 103 can be aligned with each other, whereby a finer pattern can be formed.

Next, the light absorption layer 105 is formed over the heat insulating layer 107. In a manufacturing process of a light-emitting device, the light absorption layer 105 absorbs irradiation light for heating the material layer 109 to convert the light to heat. Preferably, the light absorption layer is formed of a material having a reflectance of as low as 70% or less for the irradiation light and also high absorptance. In addition, the light absorption layer is preferably formed of a material having high heat resistance so as not to be transformed by heat. The kind of materials that is suitable for the light absorption layer 105 varies depending on the wavelength of the irradiation light for heating the material layer. For example, for light having a wavelength of 800 nm, molybdenum, tantalum nitride, titanium, tungsten, or the like is preferably used. In addition, for light having a wavelength of 1300 nm, tantalum nitride, titanium, or the like is preferably used.

In addition, in the case of having a thickness of 400 nm, a molybdenum film or a tungsten film has a reflectance of 60% or less for light at a wavelength greater than or equal to 800 nm and less than or equal to 900 nm and therefore can be suitably used for the light absorption layer. In addition, a molybdenum film or a tungsten film has a reflectance of 85% or more for light at a wavelength greater than or equal to 2000 nm and less than or equal to 2500 nm and therefore can be used for the reflective layer.

The light absorption layer 105 can be formed by any of a variety of methods. For example, by a sputtering method, the light absorption layer 105 can be formed using a target using molybdenum, tantalum, titanium, tungsten, etc., or an alloy thereof. In addition, the light absorption layer is not limited to a single layer and may include a plurality of layers.

The light absorption layer preferably has a thickness such that it does not transmit the irradiation light. The light absorption layer preferably has a thickness greater than or equal to 100 nm and less than or equal to 2 μm although it depends on a material. In particular, the light absorption layer 105 having a thickness greater than or equal to 200 nm and less than or equal to 600 nm can efficiently absorb the irradiation light to generate heat.

Note that the light absorption layer 105 may transmit part of the irradiation light as long as the evaporation material contained in the material layer 109 is heated to a sublimation temperature. However, in the case where the light absorption layer transmits part of the light, a material that does not decompose even when irradiated with light is preferably used for the material layer 109.

Note that the greater the difference in reflectance between the reflective layer and the light absorption layer is, the more preferable it is. Specifically, the difference in reflectance for the wavelength of the irradiation light is preferably 25% or more, more preferably, 30% or more.

In this embodiment mode, for the light absorption layer, a titanium film having a thickness greater than or equal to 200 nm and less than or equal to 600 nm is formed. In the case of having a thickness greater than or equal to 200 nm and less than or equal to 600 nm, a titanium film exhibits a reflectance of 67% or less for light throughout the infrared region at a wavelength greater than or equal to 800 nm and less than or equal to 2500 nm. In particular, a titanium film exhibits a reflectance of 60% or less for light in the infrared region at a wavelength greater than or equal to 800 nm and less than or equal to 1250 nm. In addition, a titanium film does not almost transmit light in the region at a wavelength greater than or equal to 300 nm and less than or equal to 2500 nm. Further, a titanium film having a thickness greater than or equal to 200 nm and less than or equal to 600 nm has an absorptance of 30% or more and thus can be suitably used for the light absorption layer.

Next, the material layer 109 containing the evaporation material is formed over the light absorption layer 105. The material layer 109 is transferred to a second substrate by sublimation. As the evaporation material, there are various kinds of materials. In addition, the material layer 109 may contain plural kinds of materials. In addition, the material layer 109 may be a single layer or a stack of a plurality of layers. By stacking a plurality of layers containing evaporation materials, co-evaporation is possible. Note that when the plurality of layers containing evaporation materials is stacked, the layers are preferably stacked so that an evaporation material having a lower decomposition temperature is contained in a layer nearer the first substrate. Alternatively, the plurality of layers is preferably stacked so that an evaporation material having a lower evaporation temperature is contained in a layer nearer first substrate. Such a structure allows a plurality of layers containing evaporation materials to be efficiently sublimed and evaporated. Note that the term "evaporation temperature" in this specification refers to a temperature at which a material is sublimed. In addition, the term "decomposition temperature" refers to a temperature at which a change is caused, by the action of heat, in at least a part of a chemical formula representing a material.

The material layer 109 is formed by any of various kinds of methods. For example, a dry method such as a vacuum evaporation method or a sputtering method can be used. Alternatively, a wet method such as a spin coating method, a spray coating method, an inkjet method, a dip coating method, a casting method, a die coating method, a roll coating method, a blade coating method, a bar coating method, a gravure coating method, or a printing method can be used. In order to form the material layer 109 by such a wet method, a desired evaporation material may be dissolved or dispersed in a solvent, and a solution or a dispersion may be adjusted. There is no particular limitation on the solvent as long as an evaporation material can be dissolved or dispersed therein and the solvent does not react with the evaporation material. Examples of the solvent includes halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. Alternatively, a mixture of plural kinds of these solvents may be used. The use of a wet method makes it possible to increase material use efficiency and to reduce manufacturing cost of a light-emitting device.

Note that the thickness of an EL layer 117 formed, in a later step, over the second substrate 111 which is the deposition target substrate depends on the material layer 109 formed over the first substrate which is the supporting substrate. Therefore, by controlling the thickness of the material layer, the thickness of the EL layer 117 formed over the second substrate 111 which is the deposition target substrate can be controlled easily. Note that the material layer does not necessarily need to be a uniform layer as long as the thickness and uniformity of the EL layer are ensured. For example, the material layer containing the evaporation material may be formed in fine island shapes or may be formed in an uneven layer shape.

Note that various kinds of materials can be used as the evaporation material regardless of whether they are organic compounds, inorganic compounds, or organic compounds containing inorganic compounds. Since many organic compounds have lower evaporation temperature than inorganic compounds, organic compounds are easily evaporated by light irradiation, and suitable for the method of manufacturing a light-emitting device of the present invention. Examples of organic compounds include light-emitting materials, carrier transporting materials, and the like used for a light-emitting device. In addition, examples of inorganic compounds include metal oxides, metal nitrides, metal halides, elementary substances of metal, and the like used for carrier-transporting layers, carrier-injecting layers, electrodes, and the like of a light-emitting device.

Next, as shown in FIG. 1B, the second substrate 111 which is the deposition target substrate is disposed to face the surface of the first substrate 101, where the reflective layer 103, the heat insulating layer 107, the light absorption layer 105, and the material layer 109 are formed. The second substrate 111 is the deposition target substrate where a desired layer is deposited by evaporation treatment.

The first substrate 101 and the second substrate 111 are disposed close to each other so as to face each other in proximity; specifically, they are disposed close to each other so that the distance d between the second substrate 111 and the surface of the evaporation material contained in the layer provided over the first substrate 101 is greater than or equal to 0 mm and less than or equal to 2 mm, preferably, greater than or equal to 0 mm and less than or equal to 0.05 mm, more preferably, greater than or equal to 0 mm and less than or equal to 0.03 mm. By reducing the distance d to around the above range, the use efficiency of the evaporation material can be improved. In addition, the precision of patterning of the EL layer 117 formed over the deposition target substrate can be improved.

Note that the distance d is defined as a distance between the surface of the material layer 109 formed over the supporting substrate and the surface of the deposition target substrate. In addition, when some layer (such as a conductive layer that functions as an electrode or an insulating layer that functions as a partition wall) is formed over the deposition target substrate, the distance d is defined as a distance between the surface of the material layer 109 over the supporting substrate and the surface of the layer formed over the deposition target substrate. Note that when the surface of the material layer formed over the supporting substrate or the surface of the layer formed over the deposition target substrate is uneven, the distance d is defined as the shortest distance between the surface of the material layer 109 over the supporting substrate and the outermost surface of the layer formed over the deposition target substrate.

In order to improve material use efficiency and also to improve the precision of patterning, although the distance between the first substrate and the second substrate is preferably short, the present invention is not limited to this structure.

In FIGS. 1B and 1C, a first electrode layer 113 is formed over the second substrate 111. Edge portions of the first electrode layer 113 are preferably covered with insulators 115. In this embodiment mode, the first electrode layer represents an electrode which serves as an anode or a cathode of a light-emitting element.

After the first substrate 101 and the second substrate 111 are disposed, light irradiation is performed from the rear surface of the first substrate 101, i.e., a surface opposite to the surface where the material layer is formed, as shown in FIG. 1C. The irradiation light is reflected in the region where the portion of the reflective layer 103 is formed, and transmitted in the opening portion provided in the reflective layer 103 to be absorbed in a portion of the light absorption layer 105 in the region overlapped with the opening portion. The absorbed light is converted to heat energy, so that a portion of the material layer 109, which is in contact with the portion of the light absorption layer 105 in the region overlapped with the opening portion, is heated to be sublimed. The sublimed evaporation material is evaporated onto the first electrode layers, thereby depositing the EL layer 117.

Note that when the first substrate 101 is irradiated with light, heat generated in the light absorption layer 105 is potentially conducted in the plane direction to the heat the reflective layer 103 in contact with the light absorption layer 105. In addition, even if the reflective layer 103 is formed using a material having a reflectance of 85% or more, a certain amount of heat is considered to be absorbed depending on the energy power of the irradiation light. However, in the evaporation donor substrate of the present invention, since the heat insulating layer 107 formed of a material having low heat conductivity is provided between the reflective layer 103 and the material layer 109, even when the reflective layer 103 is heated, conduction of heat to the material layer 109 can be blocked in the heat insulating layer 107. This results in selective sublimation of a portion of the material layer 109 in the region overlapped with the opening portion, so that the EL layer 117 having a desired pattern can be formed over the deposition target substrate.

Any of various kinds of light sources can be used as a light source of the irradiation light.

For example, a discharge lamp such as a xenon lamp or a metal halide lamp, or an exothermic lamp such as a halogen lamp or a tungsten lamp can be used as the light source. Alternatively, such a light source can be used as a flash lamp (e.g., a xenon flash lamp or a krypton flash lamp). Since a flash lamp is capable of emitting very high-intensity light repeatedly to a large area for a short time (0.1 to 10 msec), it can uniformly and efficiently heat the substrate regardless of the area of the first substrate. In addition, the flash lamp can control heating of the first substrate 101 by changing the length of emission time. In addition, the running cost can be suppressed since a flash lamp has a long life and consumes less power on standby for light emission.

Alternatively, a laser device may be used as the light source. As the laser light, it is possible to use laser light emitted from, for example, a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof. In addition, the use of a solid-state laser that uses a solid as a laser medium is advantageous in that a maintenance-free condition can be maintained for a long time and output is relatively stable.

Note that the irradiation light is preferably infrared light (at a wavelength of 800 nm or more). By the use of infrared light, conversion to heat can be efficiently conducted in the light absorption layer 105, so that the evaporation material can be sublimed efficiently.

In the method of manufacturing a light-emitting device of the present invention, since the material layer formed over the evaporation donor substrate is selectively heated so that the portion of the material layer in the region in contact with the light absorption layer is heated, the length of time for light irradiation may be relatively short compared to the case where the entire surface of material layer is heated. For example, when a halogen lamp is used as the light source, by keeping 500 to 800° C. for about 7 to 15 seconds, the portion of the material layer in the region overlapped with the opening portion is sublimed to be evaporated onto the deposition target substrate.

In addition, deposition is preferably performed in a reduced-pressure atmosphere. The reduced-pressure atmosphere can be obtained by evacuation of the deposition chamber with a vacuum evacuation means to a vacuum of about $5 \times 10^{-3}$ Pa or less, preferably, about $10^{-4}$ to $10^{-6}$ Pa.

Note that although the case where the second substrate which is the deposition target substrate is located below the first substrate which is the supporting substrate is illustrated in this embodiment mode, the present invention is not limited to this structure. The orientations of the substrates can be set as appropriate.

Figure 2A:
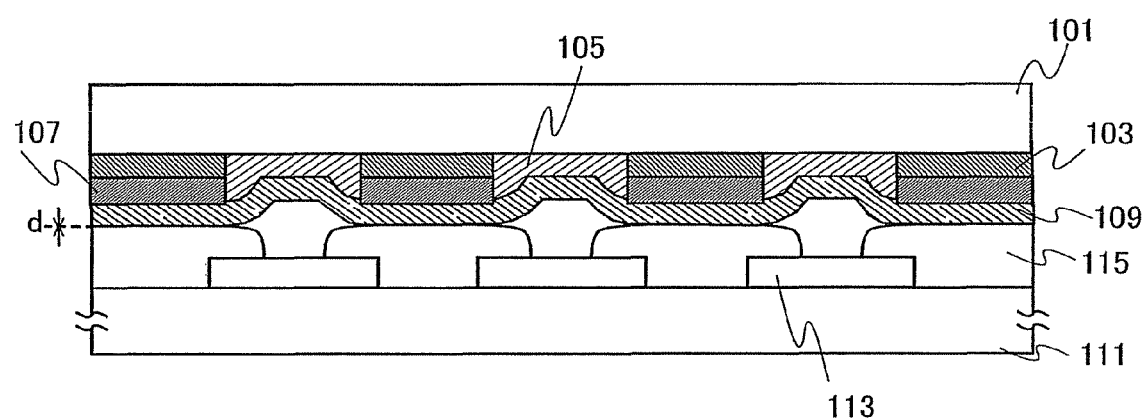
FIGS. 2A and 2B are schematic views each illustrating a cross section in a deposition process according to an aspect of the present invention.

FIG. 2A shows the case where the distance d is 0 mm, that is, the case where the insulator 115 formed over the second substrate 111 is in contact with the material layer 109 formed over the first substrate 101. By reducing the distance d in this manner, material use efficiency can be improved. In addition, the precision of patterning of the layer formed over the deposition target substrate can be improved. Note that in the case where the surface of the deposition target substrate is even, the distance d is preferably more than 0 mm.

Figure 2B:
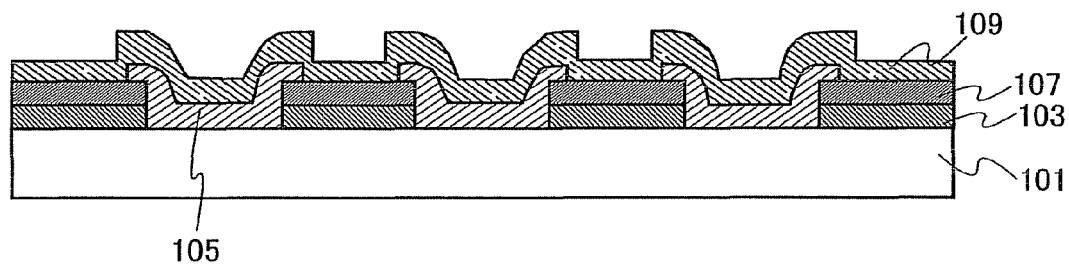

In addition, the embodiment modes of the present invention are not limited to the structure shown in FIGS. 1A to 1C. For example, as shown in FIG. 2B, the light absorption layer 105 may be formed over the entire surface of the first substrate 101 and then patterned in an island shape so as to cover the opening portions of the reflective layer 103 and the heat insulating layer 107. Compared to the case where the light absorption layer is formed over the entire surface, in the case where the light absorption layer 105 is patterned in an island shape, as shown in FIG. 2B, heat conduction in the plane direction of the light absorption layer can be prevented. Therefore, the EL layer can be patterned more finely, and accordingly a high-definition light-emitting device can be realized.

In the deposition method applied to a light-emitting device of the present invention, by controlling the thickness of the material layer formed over the supporting substrate, the thickness of the EL layer onto the deposition target substrate by evaporation treatment can be controlled. That is, the material layer formed over the supporting substrate may be evaporated as it is; thus, a thickness monitor is not needed. Therefore, a user does not have to adjust the evaporation rate by use of a thickness monitor, and the deposition process can be fully automated. Accordingly, productivity can be increased.

In addition, by the deposition method applied to a light-emitting device of the present invention, when the material layer contains plural kinds of evaporation materials, the EL layer containing the same evaporation materials at roughly the same weight ratio as those of the material layer can be formed onto the deposition target substrate. As described above, in the deposition method of the present invention, when deposition is performed using plural kinds of evaporation materials having different evaporation temperatures, unlike the case of co-evaporation, the evaporation rate of each evaporation material does not need to be controlled. Thus, without complicated control of the evaporation rate or the like, a desired layer containing different kinds of evaporation materials can be deposited easily with high precision.

In addition, application of the present invention facilitates patterning of a light-emitting layer; thus, it also facilitates manufacture of a light-emitting device. Further, a fine pattern can be formed; thus, a high-definition light-emitting device can be obtained. Furthermore, application of the present invention makes it possible to use, as the light source, a lamp heater or the like which is inexpensive but provides a large energy power can be used instead of a laser device. Moreover, by the use of a lamp heater or the like as the light source, deposition can be performed onto a large area at a time; thus, cycle time can be reduced. Accordingly, manufacturing cost of a light-emitting device can be reduced.

Moreover, by the deposition method of the present invention, a desired evaporation material can be formed onto the deposition target substrate without waste of the evaporation material. Thus, use efficiency of an evaporation material is increased, and cost can be reduced. Moreover, an evaporation material can be prevented from being attached to an inner wall of a deposition chamber, and thus maintenance of a deposition apparatus can be made easier.

Accordingly, application of the present invention makes it easy to deposit a desired layer containing different kinds of evaporation materials and makes it possible to increase productivity in manufacture of a light-emitting device using the layer containing different kinds of evaporation materials, or the like.

In addition, the use of the evaporation donor substrate of the present invention makes it possible to deposit an evaporation material with high use efficiency and to reduce cost. Furthermore, the use of the evaporation donor substrate of the present invention makes it possible to form a film having a desired shape with high precision.

Note that this embodiment mode can be combined with any other embodiment mode described in this specification as appropriate.

Embodiment Mode 2

In this embodiment mode, an evaporation donor substrate of the present invention, which differs in structure from the evaporation donor substrate in the above embodiment mode, is described. Note that when there is no particular description, the evaporation donor substrate described in this embodiment mode is formed using a material and a manufacturing method similar to the material and the method in the above embodiment mode.

Figure 3A:
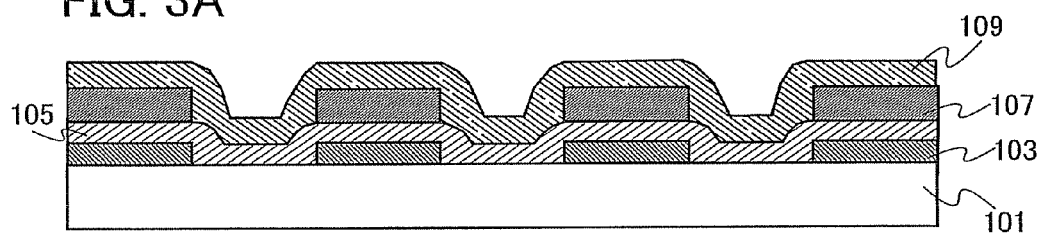
FIGS. 3A to 3C are schematic views each illustrating a cross section in a deposition process according to an aspect of the present invention.

FIG. 3A shows one example of an evaporation donor substrate of the present invention. In FIG. 3A, the reflective layer 103 including an opening portion is formed over the first substrate 101 which is the supporting substrate. In addition, the light absorption layer 105 is formed over the entire surface of the first substrate 101 so as to cover the opening portion in the reflective layer 103. The heat insulating layer 107 is formed over the light absorption layer 105 and includes an opening portion in a region overlapped with the opening portion included in the reflective layer 103. The material layer 109 containing an evaporation material is formed over the light absorption layer 105 with the heat insulating layer 107 interposed therebetween so as to cover the opening portion of the heat insulating layer 107.

Figure 3B:
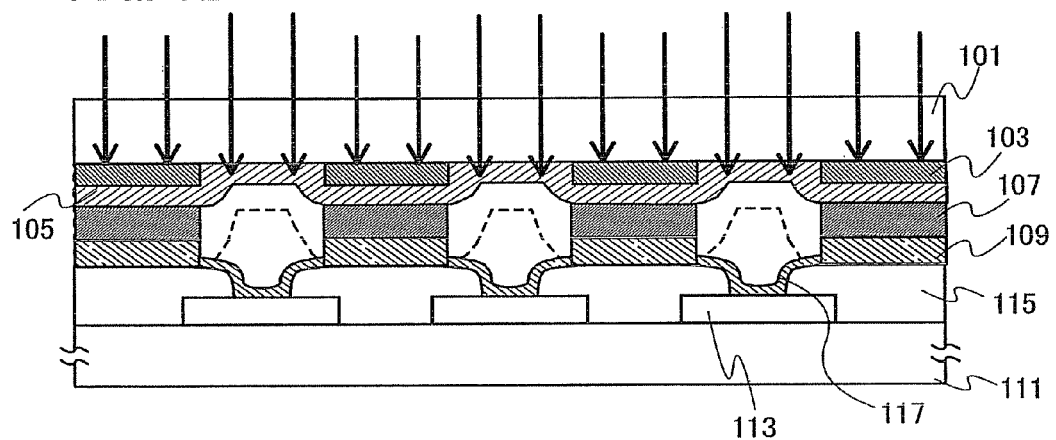

Next, as shown in FIG. 3B, the second substrate 111 which is the deposition target substrate is disposed to face the surface of the first substrate 101 where the reflective layer 103, the heat insulating layer 107, the light absorption layer 105, and the material layer 109 are formed. The second substrate 111 is the deposition target substrate where a desired layer is deposited by evaporation treatment.

The second substrate 111 includes the first electrode layer 113. Edge portions of the first electrode layer 113 are preferably covered with the insulators 115. In this embodiment mode, the first electrode layer represents an electrode which serves as the anode or a cathode of a light-emitting element.

After the first substrate 101 and the second substrate 111 are disposed, light irradiation is performed from the rear surface of the first substrate 101, that is, a surface opposite to the surface where the material layer 109 is formed, as shown in FIG. 3B. The irradiation light is reflected in the region where the reflective layer 103 is formed, and transmitted in the opening portion provided in the reflective layer 103 to be absorbed in the portion of the light absorption layer 105 in the region overlapped with the opening portion, that is, the portion of the light absorption layer 105 in the region in contact with the first substrate. The light absorbed in the light absorption layer is converted to heat energy, so that the region of the material layer 109 in the region in contact with the light absorption layer 105 is heated to be sublimed. The sublimed evaporation material is evaporated onto the first electrode layer, thereby depositing the EL layer 117.

Note that when the first substrate 101 is irradiated with light, heat generated in the light absorption layer 105 is potentially conducted in the plane direction to heat the reflective layer 103 and the portion of the light absorption layer 105 in the region overlapped with the reflective layer 103. In addition, even if the reflective layer 103 is formed using a material having a reflectance of 85% or more, a certain amount of heat is considered to be absorbed depending on the energy power of the irradiation light. However, in the evaporation donor substrate of the present invention, since the heat insulating layer 107 formed of a material having low heat conductivity is provided between the reflective layer 103 and the material layer 109, even when the reflective layer 103 and the portion of the light absorption layer 105 in the region overlapped with the reflective layer are heated, conduction of heat to the material layer 109 can be blocked in the heat insulating layer 107. This structure can suppress heating of the portion of the material layer 109 in the region overlapped with the reflective layer 103, and the material layer 109 is selectively sublimed to result in sublimation of the portion of the material layer 109 in the region overlapped with the opening portion, so that the EL layer 117 having a desired pattern can be formed over the deposition target substrate.

In addition, when the EL layer is formed over the deposition target substrate, as described above, the distance d between the first substrate which is the evaporation donor substrate and the second substrate which is the deposition target substrate is preferably short. However, if a surface of the light absorption layer that absorbs light to generate heat is too close to a surface of the second substrate, a deposition region (a region onto which the evaporation material is deposited) of the second substrate is potentially heated by radiant heat from the light absorption layer, whereby the deposited EL layer is decomposed or crystallized. Therefore, the distance between the surface of the portion of the light absorption layer in the region overlapped with the opening portion and the surface of the deposition region on the second substrate is preferably greater than or equal to 1 μM and less than or equal to 10 μm in case the distance d is less than or equal to 0.03 mm, for example, the outermost surface of the first substrate and the outermost surface of the second substrate is in contact with each other.

In the evaporation donor substrate described in this embodiment mode, the heat insulating layer is formed above the light absorption layer, and by controlling the thickness of the heat insulating layer, the distance between the light absorption layer and the surface of the deposition region on the second substrate can be controlled with the distance d between the first substrate and the second substrate kept short; thus, the precision of patterning of the EL layer can be improved.

Figure 3C:
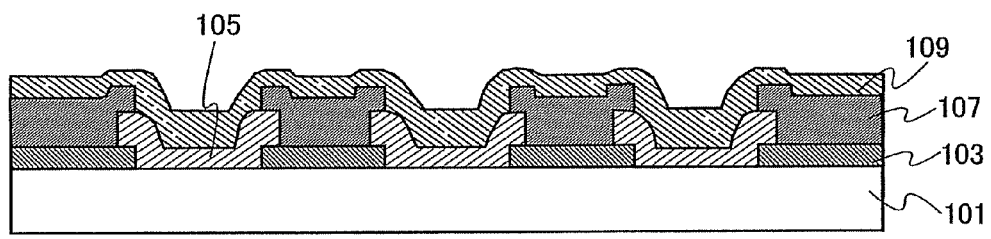

In addition, the embodiment modes of the present invention are not limited to the structure shown in FIG. 3A. For example, as shown in FIG. 3C, the light absorption layer 105 may be formed over the entire surface of the first substrate 101, and then etched to be patterned in an island shape so as to cover the opening portion of the reflective layer 103. Over the patterned light absorption layer 105, the heat insulating layer 107 is formed over the entire surface of the first substrate 101, and then patterned. Then, the material layer 109 is formed over the heat insulating layer 107; accordingly, the evaporation donor substrate shown in FIG. 3C can be obtained. In the case where the light absorption layer 105 is patterned in an island shape, as shown in FIG. 3C, since the area of contact between the light absorption layer and the heat insulating layer is small compared to the case where the light absorption layer is formed over the entire surface, heat conduction from the light absorption layer can be further suppressed. Accordingly, energy of the irradiation light can be effectively utilized; thus, irradiation time can be reduced. In addition, heat conduction in the plane direction of the light absorption layer can be prevented compared to the case where the light absorption layer is formed over the entire surface. Therefore, the EL layer can be patterned more finely, and accordingly a high-definition light-emitting device can be realized.

Application of the present invention facilitates patterning of a light-emitting layer; thus, it also facilitates manufacture of a light-emitting device. Further, a fine pattern can be formed; thus, a high-definition light-emitting device can be obtained. Furthermore, application of the present invention makes it possible to use, as a light source, a lamp heater or the like which is inexpensive but provides a large amount of heat can be used instead of a laser device. Moreover, by the use of a lamp heater or the like as a light source, deposition can be performed onto a large area at a time; thus, cycle time can be reduced. Accordingly, manufacturing cost of a light-emitting device can be reduced.

Moreover, by the deposition method of the present invention, a desired evaporation material can be formed onto the deposition target substrate without waste of the evaporation material. Thus, use efficiency of an evaporation material is increased, and cost can be reduced. Moreover, an evaporation material can be prevented from being attached to an inner wall of a deposition chamber, and thus maintenance of a deposition apparatus can be made easier.

Accordingly, application of the present invention makes it easy to deposit a desired layer containing different kinds of evaporation materials and makes it possible to increase productivity in manufacture of a light-emitting device or the like using the layer containing different kinds of evaporation materials.

In addition, the use of the evaporation donor substrate of the present invention makes it possible to deposit an evaporation material with high use efficiency and to reduce cost. Furthermore, the use of the evaporation donor substrate of the present invention makes it possible to form a film having a desired shape with high precision.

Note that this embodiment mode can be combined with any other embodiment mode described in this specification as appropriate.

Embodiment Mode 3

In this embodiment mode, a manufacturing method of a full-color display device by using any evaporation donor substrate used in the above embodiment modes is described.

Although an example in which deposition is performed onto adjacent the first electrode layers 113 in a single deposition process is described in each of Embodiment Modes 1 and 2, when a full-color display device is manufactured, light-emitting layers for emitting light of different colors are formed in different regions through a plurality of deposition steps.

A manufacturing example of a light-emitting device capable of full color display is described below. Here, an example of a light-emitting device using light-emitting layers for emitting light of three colors is described.

Three evaporation donor substrates shown in FIG. 1A, FIG. 2B, FIG. 3A, or FIG. 3C are prepared. In the evaporation donor substrates, layers containing different kinds of evaporation materials are formed. Specifically, a first evaporation donor substrate provided with a material layer for a red light-emitting layer, a second evaporation donor substrate provided with a material layer for a green light-emitting layer, and a third evaporation donor substrate provided with a material layer for a blue light-emitting layer are prepared.

In addition, one deposition target substrate provided with the first electrode layer is prepared. Note that the insulator serving as a partition wall covering each edge portion of the first electrode layer is preferably provided so that the adjacent first electrode layers are not short-circuited. A region which serves as a light-emitting region corresponds to part of the first electrode layer, that is, a region of the first electrode layer, which is exposed without being overlapped with the insulator.

Then, the deposition target substrate and the first evaporation donor substrate are superimposed on each other and aligned with each other. Thus, the deposition target substrate is preferably provided with an alignment marker. In addition, the first evaporation donor substrate is also preferably provided with an alignment marker. Note that, since the first evaporation donor substrate is provided with a light absorption layer and the material layer for the red light-emitting layer, a portion of the light absorption layer and a portion of the material layer for the red light-emitting layer over and near the alignment marker are preferably removed in advance.

Then, light irradiation is performed from the rear surface of the first evaporation donor substrate. The portion of the light absorption layer, which is located over the opening portion of the reflective layer, absorbs the irradiation light to generate heat, whereby the portion of the material layer for the red light-emitting layer, which is in contact with this portion of the light absorption layer, is sublimed; thus, first deposition onto the first electrode layer provided over the deposition target substrate is performed. After the first deposition is completed, the first evaporation donor substrate is moved away from the deposition target substrate.

In the evaporation donor substrate of the present invention, since the heat insulating layer is formed in contact with the light absorption layer, even when heat converted in the light absorption layer is conducted in the plane direction of the light absorption layer, the portion of the material layer, which is located above the reflective layer, can be prevented from being heated. Thus, the EL layer can be formed over the deposition target substrate with high precision.

Next, the deposition target substrate and the second evaporation donor substrate are superimposed on each other and aligned with each other. The second evaporation donor substrate is provided with the opening portion of the reflective layer in a position shifted by one pixel from that of the first evaporation donor substrate used in the first deposition.

Then, light irradiation is performed from the rear surface of the second evaporation donor substrate. A portion of the light absorption layer, which is located over the opening portion of the reflective layer, absorbs the irradiation light, absorbs the irradiation light to generate heat, whereby the portion of the material layer for the green light-emitting layer, which is in contact with this light absorption layer, is sublimed; thus, second deposition onto the first electrode layer provided over the deposition target substrate is performed. After the second deposition is completed, the second evaporation donor substrate is moved away from the deposition target substrate.

Next, the deposition target substrate and the third evaporation donor substrate are superimposed on each other and aligned with each other. The third evaporation donor substrate is provided with the opening portion of the reflective in a position shifted by two pixels from that of the first evaporation donor substrate used in the first deposition.

Then, light irradiation is performed from the rear surface of the third evaporation donor substrate to perform third deposition. A state right before this third deposition is performed corresponds to the top view of FIG. 4A. A reflective layer 411 includes an opening portion 412. In addition, the light absorption layer is formed in regions corresponding to the opening portions 412. In addition, in regions of the deposition target substrate, which correspond to the opening portions 412, the first electrode layer is exposed without being covered with an insulator 413. Note that a first film (R) 421 deposited through the first deposition and a second film (G) 422 deposited through the second deposition are located under regions indicated by dotted lines in FIG. 4A.

Figure 4A:
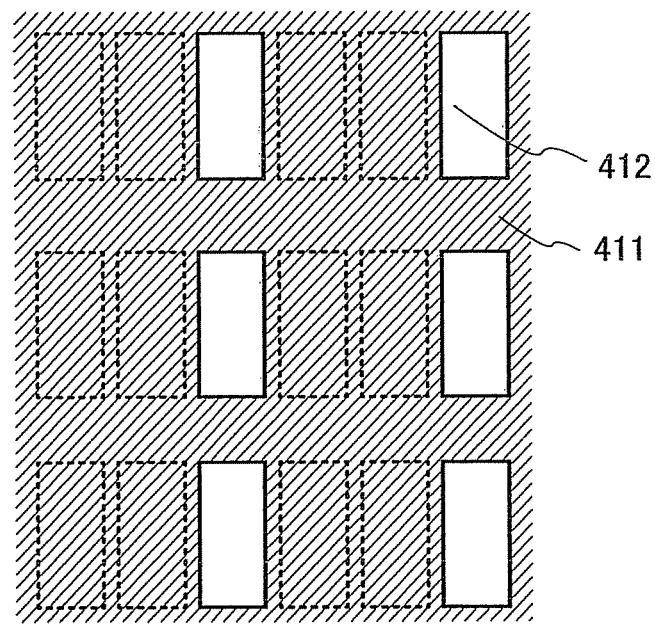
FIGS. 4A and 4B each illustrate a deposition process according to an aspect of the present invention.
Figure 4B:
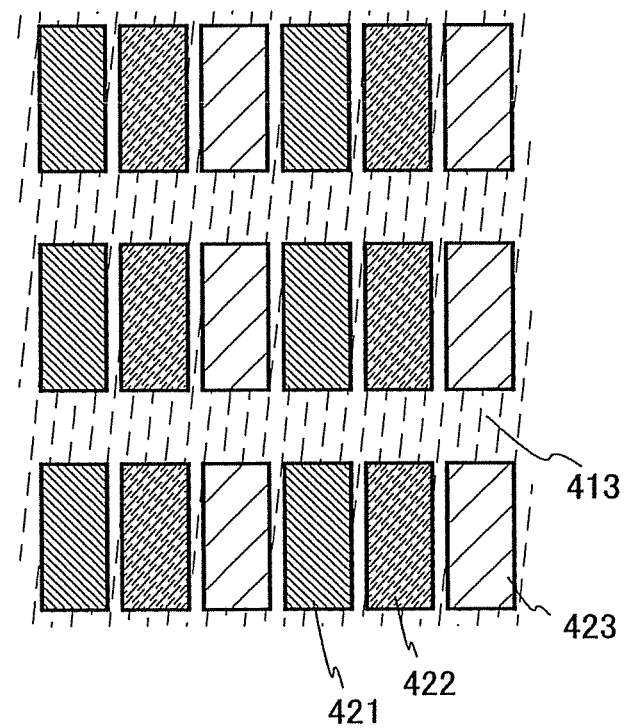

Then, a third film (B) 423 is formed through the third deposition (FIG. 4B). The irradiation light passes through the opening portion of the reflective layer to be absorbed in the portion of the light absorption layer, which is formed in the region corresponding to the opening portion of the reflective layer, whereby this portion of the light absorption layer, which is formed in the region corresponding to the opening portion of the reflective layer, generates heat. Accordingly, the portion of the material layer for the blue light-emitting layer, which is in contact with the portion of the light absorption layer, which is formed in the region corresponding to the opening portion, is sublimed; thus, the third deposition onto the first electrode layer provided over the deposition target substrate is performed. After the third deposition is completed, the third evaporation donor substrate is moved away from the deposition target substrate.

In this manner, the first film (R) 421, the second film (G) 422, and the third film (B) 423 are selectively formed at regular intervals. Then, a second electrode layer is formed over these films. Thus, light-emitting elements are formed.

Through the above-described process, a full-color display device can be manufactured.

Although FIGS. 4A and 4B each show an example in which the opening portion 412 of the reflective layer formed over the evaporation donor substrate has a rectangular shape, the present invention is not particularly limited to this shape and a stripe opening portion may be employed. In the case where the stripe opening portion is employed, although deposition is also performed between light-emitting regions for emitting light of the same color, the deposition between light-emitting regions is performed over the insulator 413, and thus a portion overlapped with the insulator 413 does not serve as a light-emitting region.

Figure 5A:
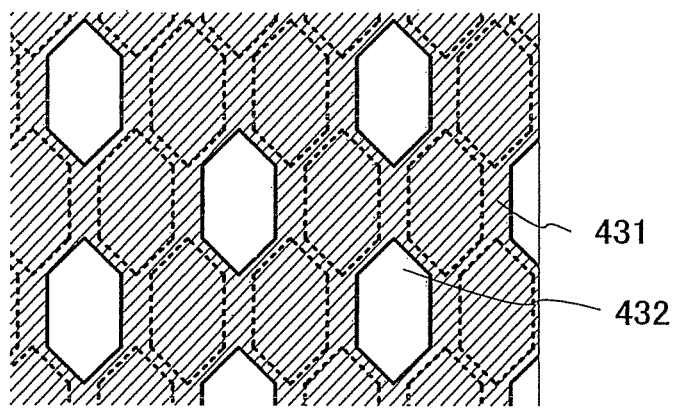
FIGS. 5A and 5B each illustrate a deposition process according to an aspect of the present invention.
Figure 5B:
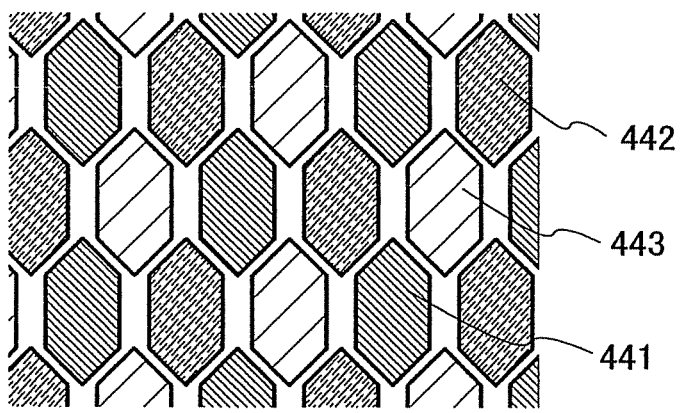

In addition, there is no particular limitation on the arrangement of the pixels. As shown in FIG. 5B, a full-color display device may be realized in such a manner that the shape of each pixel is polygonal, for example, hexagonal and first films (R) 441, second films (G) 442, and third films (B) 443 are arranged. In order to form polygonal pixels shown in FIG. 5B, deposition may be performed using an evaporation donor substrate including a reflective layer 431 having a polygonal opening portion 432 shown in FIG. 5A, a heat insulating layer provided over the reflective layer 431, and a light absorption layer provided in the region corresponding to the opening portion 432.

Application of the present invention facilitates formation of an EL layer included in a light-emitting element, and also facilitates manufacture of a light-emitting device including this light-emitting element. Application of the present invention facilitates patterning of a light-emitting layer; thus, it also facilitates manufacture of a light-emitting device. Further, a fine pattern can be formed; thus, a high-definition light-emitting device can be obtained. Furthermore, application of the present invention makes it possible to use, as a light source, a lamp heater or the like which is inexpensive but provides a large amount of heat can be used instead of a laser device. Accordingly, manufacturing cost of a light-emitting device can be reduced.

In addition, by applying the present invention, less complicated control is needed in the case where a light-emitting layer in which a dopant material is dispersed in a host material is formed, compared to the case where co-evaporation is applied. Further, since the additive amount of the dopant material, or the like is easy to control, deposition can be performed easily and precisely, and therefore a desired emission color can be obtained more easily. In addition, use efficiency of an evaporation material can be increased; thus, cost can be reduced.

Note that this embodiment mode can be combined with any other embodiment mode described in this specification as appropriate.

Embodiment Mode 4

In this embodiment mode, examples of deposition apparatuses which enable manufacture of the light-emitting device of the present invention are described. FIGS. 6A and 6B and FIGS. 7A and 7B are schematic cross-sectional views of deposition apparatuses of this embodiment mode.

Figure 6A:
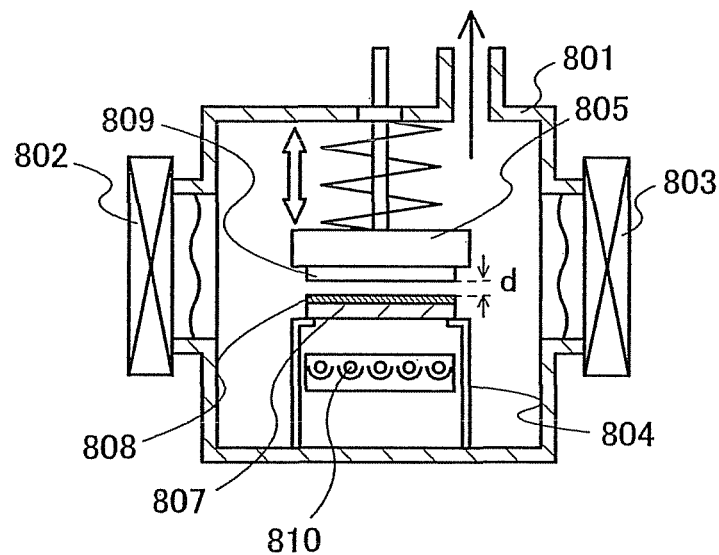
FIGS. 6A and 6B each illustrate an example of a deposition apparatus.

In FIG. 6A, a deposition chamber 801 is a vacuum chamber and is connected to other treatment chambers via a first gate valve 802 and a second gate valve 803. In addition, the deposition chamber 801 includes at least a substrate supporting mechanism which is a first substrate supporting means 804, a deposition target substrate supporting mechanism which is a second substrate supporting means 805, and a light source 810.

First, in another deposition chamber, with any structure described in the above embodiment modes, a material layer 808 is formed over a first substrate 807 where a reflective layer, a light absorption layer, and a heat insulating layer are formed. In this embodiment mode, the first substrate 807 which is a supporting substrate corresponds to the first substrate 101, and the material layer 808 corresponds to the material layer 109 shown in FIGS. 1A to 1C. Note that although not shown, between the first substrate 807 and the material layer 808, the reflective layer, the light absorption layer, and the heat insulating layer are formed with the any structure described in the above embodiment modes. In this embodiment mode, as the first substrate 807, a square plate substrate containing copper as its main component is used. In addition, for the material layer 808, a material that can be evaporated is used.

Note that there is no particular limitation on the shape of the first substrate 807 as long as the first substrate 807 has the same area as or a larger area than a deposition target substrate. In addition, the material layer 808 can be formed by a dry method or a wet method, and in particular, a wet method is preferable. For example, a spin coating method, a printing method, an inkjet method, or the like can be used.

Next, the first substrate 807 is transported to the deposition chamber 801 from the other deposition chamber and is set on the substrate supporting mechanism. In addition, the first substrate 807 is fixed to the substrate supporting mechanism so that a surface of the first substrate 807, on which the material layer 808 is formed, faces a deposition target surface of the second substrate 809 which is the deposition target substrate.

Figure 6B:
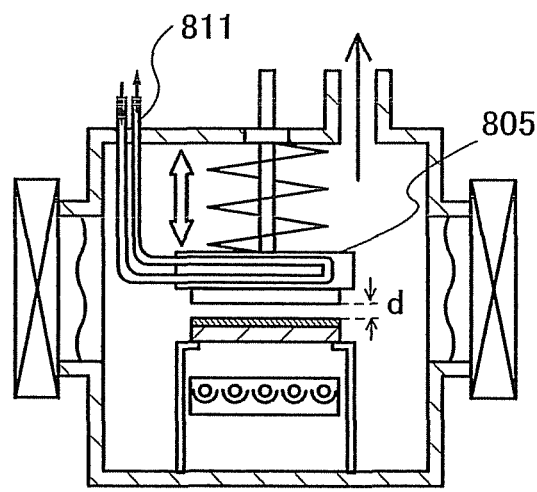

The second substrate supporting means 805 is moved so that a distance between the first substrate 807 and the second substrate 809 becomes a distance d. Note that the distance d is defined as a distance between a surface of the material layer 808 formed over the first substrate 807 and a surface of the second substrate 809. In addition, when some layer (e.g., a conductive layer which functions as an electrode or an insulating layer which functions as a partition wall) is formed on the second substrate 809, the distance d is defined as a distance between the surface of the material layer 808 over the first substrate 807 and the surface of the layer formed on the second substrate 809. Note that when the surface of the second substrate 809 or the surface of the layer fainted on the second substrate 809 is uneven, the distance d is defined as the shortest distance between the surface of the material layer 808 over the first substrate 807 and the outermost surface of the second substrate 809 or the layer formed on the second substrate 809. Here, the distance d is set to be 2 mm. In addition, if the second substrate 809 is hard like a quartz substrate and formed of a material which is unlikely to be deformed (warped, bended, or the like), the distance d can be reduced to 0 mm as the minimum distance. In addition, although FIGS. 6A and 6B show examples in which the deposition target substrate supporting mechanism is moved while the substrate supporting mechanism is fixed for controlling the distance between the substrates, a structure may also be employed in which the substrate supporting substrate is moved while the deposition target substrate supporting mechanism is fixed. Alternatively, both the substrate supporting mechanism and the deposition target substrate supporting mechanism may be moved. Note that FIG. 6A shows a cross section of a step in which the second substrate supporting means 805 is moved so that the first substrate and the second substrate are disposed close to each other to have the distance d therebetween.

Alternatively, a structure may also be employed in which the substrate supporting mechanism and the deposition target substrate supporting mechanism are moved not only in a vertical direction but also in a horizontal direction and precise alignment is performed. In addition, the deposition chamber 801 may include an alignment mechanism such as CCD for precise alignment or measurement of the distance d. In addition, a temperature sensor and/or a humidity sensor etc. for measurements inside the deposition chamber 801 may be provided.

The supporting substrate is irradiated with light from the light source 810. This allows the material layer 808 over the supporting substrate to be heated and then sublimed in a short time, and thus an evaporation material is deposited onto the deposition target surface (i.e., the lower surface) of the second substrate 809, which is placed so as to face the material layer 808. In the deposition apparatus shown in FIG. 6A, since the material layer 808 which is an evaporation source may be evaporated as it is, deposition with high uniformity in thickness can be performed onto the second substrate without using a thickness monitor. In addition, although a substrate is rotated in a conventional evaporation apparatus, the deposition target substrate is fixed during deposition in the deposition apparatus shown in FIG. 6A, and thus this deposition apparatus is suitable for deposition onto a large-area glass substrate that is easily broken. In addition, in the deposition apparatus in FIG. 6A, the supporting substrate is also stopped during deposition.

Note that a large part of the light source 810 is preferably opposite the supporting substrate so that uniform heating can be performed.

In addition, in order to reduce influence that heat from the light source on standby has on the material layer 808 over the supporting substrate, an openable and closable shutter for thermal insulation on standby (before an evaporation process) may be provided between the light source 810 and the first substrate 807 (supporting substrate).

In addition, the light source 810 may be a heating means capable of uniform heating in a short time. For example, a laser device or a lamp may be used.

As the laser light, it is possible to use laser light emitted from, for example, a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof. In addition, the use of a solid-state laser that uses a solid as a laser medium is advantageous in that a maintenance-free condition can be maintained for a long time and output is relatively stable.

For example, a discharge lamp such as a xenon lamp or a metal halide lamp or an exothermic lamp such as a halogen lamp or a tungsten lamp can be used as a lamp. Alternatively, these light sources can be used as flash lamps. Since a flash lamp is capable of emitting very high-intensity light repeatedly to a large area for a short time (0.1 to 10 msec), it can uniformly and efficiently heat the substrate regardless of the area of the first substrate. In addition, the flash lamp can control heating of the first substrate 101 by changing the length of emission time. In addition, the running cost can be suppressed since the flash lamp has a long life and consumes less power on standby for light emission. In addition, rapid heating is easily performed by using the flash lamp, whereby a vertical movement mechanism, a shutter, or the like in the case of using the heater can be simplified. Therefore, the deposition apparatus can be made smaller.

In addition, although. FIG. 6A shows an example in which the light source 810 is provided in the deposition chamber 801, part of an inner wall of the deposition chamber may be made of a light-transmitting member and the light source 810 may be placed outside the deposition chamber. By providing the light source 810 outside the deposition chamber 801, maintenance such as replacement of light bulbs of the light source 810 can be made easier.

In addition, FIG. 6B shows an example of a deposition apparatus provided with a mechanism for controlling the temperature of the second substrate 809. In FIG. 6B, components common to FIG. 6A are not denoted by reference numerals. In FIG. 6B, the second substrate supporting means 805 includes a tube 811 through which a heat medium flows. By making a refrigerant flow through the tube 811 as a heat medium, the second substrate supporting means 805 can be used as a cold plate. Note that the tube 811 can follow the vertical movement of the second substrate supporting means 805. As the heat medium, for example, water, silicone oil, or the like can be used. Note that, although an example is described here in which the tube 811 through which a refrigerant gas or a liquid refrigerant flows is used, the second substrate supporting means 805 may be provided with a Peltier element or the like as a cooling means. Alternatively, not a cooling means but a heating means may be provided. For example, a heat medium for heating may flow through the tube 811.

The deposition apparatus in FIG. 6B is useful for stacking different kinds of material layers. For example, when a first EL layer has been formed on the second substrate, a second EL layer formed of a material having higher evaporation temperature than the first EL layer can be stacked on the first EL layer. In FIG. 6A, because the second substrate and the first substrate are disposed close to each other, the first EL layer which has been formed on the second substrate could be sublimed. Thus, when the deposition apparatus in FIG. 6B is used, the second EL layer can be stacked on the first EL layer which has been formed on the second substrate while sublimation of the first EL layer is suppressed by a cooling mechanism.

In addition, the second substrate supporting means 805 may be provided with a heating means such as a heater, in addition to the cooling mechanism. A mechanism for adjusting (heating or cooling) the temperature of the second substrate can suppress warpage or the like of the substrate.

Figure 7A:
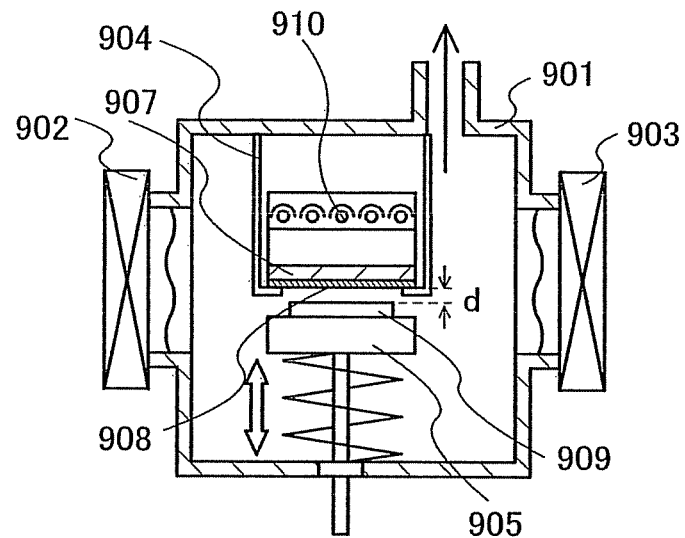
FIGS. 7A and 7B each illustrate an example of a deposition apparatus.

Note that, although FIGS. 6A and 6B each show the example of the deposition apparatus employing a face-down system in which the deposition surface of the deposition target substrate faces downward, a deposition apparatus employing a face-up system, as shown in FIG. 7A, can also be employed.

In FIG. 7A, a deposition chamber 901 is a vacuum chamber and is connected to other treatment chambers via a first gate valve 902 and a second gate valve 903. In addition, the deposition chamber 901 includes at least a deposition target substrate supporting mechanism which is a second substrate supporting means 905, a substrate supporting mechanism which is a first substrate supporting means 904, and a light source 910.

A deposition process is as follows. First, in another deposition chamber, with any structure described in the above embodiment modes, a material layer 908 is formed over a first substrate 907 where a reflective layer, a light absorption layer, and a heat insulating layer are formed. In this embodiment mode, the first substrate 907 which is a supporting substrate corresponds to the first substrate 101 shown in FIGS. 1A to 1C. Note that although not shown, between the first substrate 907 and the material layer 908, the reflective layer, the light absorption layer, and the heat insulating layer are formed with any structure described in the above embodiment modes. There is no particular limitation on the shape of the first substrate 907 as long as the first substrate 907 has the same area as or a larger area than a deposition target substrate. In addition, the material layer 908 corresponds to the material layer 109 and contains plural kinds of materials which can be evaporated and have different evaporation temperatures. The material layer 908 can be formed by a dry method or a wet method, and in particular, a wet method is preferable. For example, a spin coating method, a printing method, an inkjet method, or the like can be used.

Next, the first substrate 907 is transported to the deposition chamber 901 from the other deposition chamber and is set on the substrate supporting mechanism. In addition, a second substrate is fixed to the deposition target substrate supporting mechanism so that a surface of the first substrate 907, over which the material layer 908 is formed, faces a deposition target surface of a second substrate 909. In addition, as shown in FIG. 7A, this structure is an example of a face-up system in which the deposition surface of the substrate faces upward. In the case of the face-up system, a large-area glass substrate that is easily bent is put on a flat stage, or the glass substrate is supported by a plurality of pins, so that the substrate has no flexure; accordingly, a deposition apparatus can be realized with which a uniform thickness can be obtained over an entire surface of the substrate.

The second substrate supporting means 905 is moved so that a distance between the first substrate 907 and the second substrate 909 becomes a distance d. Note that the distance d is defined as a distance between a surface of the material layer 908 formed on the first substrate 907 and a surface of the second substrate 909. In addition, when some layer (e.g., a conductive layer which functions as an electrode or an insulating layer which functions as a partition wall) is formed over the second substrate 909, the distance d is defined as a distance between the surface of the material layer 908 on the first substrate 907 and the surface of the layer formed over the second substrate 909. Note that when the surface of the second substrate 909 or the surface of the layer formed over the second substrate 909 is uneven, the distance d is defined as the shortest distance between the surface of the material layer 908 on the first substrate 907 and the outermost surface of the second substrate 909 or the layer formed over the second substrate 909. In addition, although an example in which the deposition target substrate supporting mechanism is moved while the substrate supporting mechanism is fixed is described, a structure may also be employed in which the substrate supporting substrate is moved while the deposition target substrate supporting mechanism is fixed. Alternatively, both the substrate supporting mechanism and the deposition target substrate supporting mechanism may be moved for adjusting the distance d.

As shown in FIG. 7A, the supporting substrate is irradiated with light from the light source 910 while the distance between the substrates is retained at the distance d. Note that a large part of the light source 910 is preferably opposite the supporting substrate so that uniform heating can be performed.

By irradiating the supporting substrate with light from the light source 910, the material layer 908 on the supporting substrate is heated to be sublimed in a short time, and thus an evaporation material is deposited onto the deposition target surface (i.e., the upper surface) of the second substrate 909, which is placed so as to face the surface of the material layer 908. This makes it possible to realize a small-sized deposition apparatus the capacity of which is drastically smaller than that of a conventional evaporation apparatus which is a large-capacity chamber.

In addition, there is no particular limitation on the light source as long as the light source may be a heating means capable of uniform heating in a short time. For example, a laser device or a lamp may be used. In the example shown in FIG. 7A, the light source 910 is fixed above the second substrate and deposition is performed onto the upper surface of the second substrate 909 immediately after the light source 910 emits light.

Figure 7B:
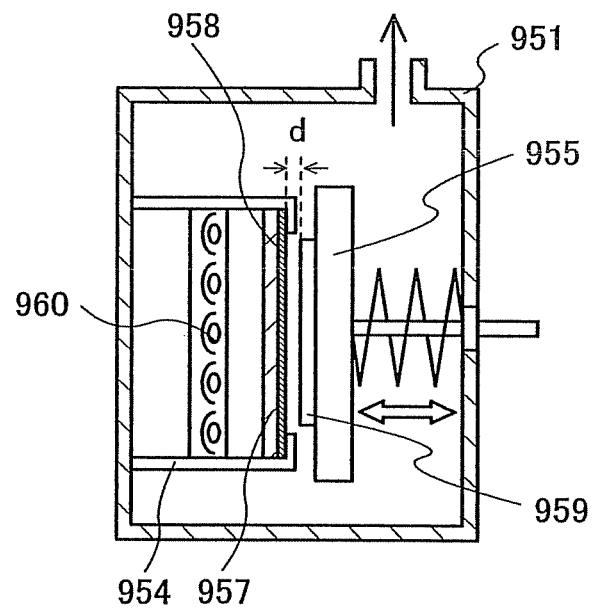

Note that, although FIGS. 6A and 6B and FIG. 7A each show the example of the deposition apparatus employing a system in which a substrate is placed horizontally, a deposition apparatus employing a system in which a substrate is placed vertically, as shown in FIG. 7B, can also be used.

In FIG. 7B, a deposition chamber 951 is a vacuum chamber. In addition, the deposition chamber 951 includes at least a substrate supporting mechanism which is a first substrate supporting means 954, a deposition target substrate supporting mechanism which is a second substrate supporting means 955, and a light source 960.

Although not shown, the deposition chamber 951 is connected to a first transport chamber to and from which a deposition target substrate is transported while being placed vertically. In addition, the deposition chamber 951 is also connected to a second transport chamber to and from which a supporting substrate is transported while being placed vertically, which is also not shown. In addition, in this specification, vertical placement of a substrate refers to placement of a substrate in which a substrate surface makes a right angle or about a right angle (ranging from 70 to 110°) with a horizontal surface. A large-area glass substrate or the like is easy to bend and therefore preferably transported with the vertical placement.

In addition, as the light source 960, a lamp is more suitable for heating of a large-area glass substrate than a laser device.

A deposition process is as follows. First, in another deposition chamber, with any structure described in the above embodiment modes, a material layer 958 is formed on a first substrate 957 where a reflective layer, a light absorption layer, and a heat insulating layer are formed. Note that the first substrate 957 corresponds to the first substrate 101 shown in FIGS. 1A to 1C, and the material layer 958 corresponds to the material layer 109.

Next, the first substrate 957 is transported to the deposition chamber 951 from the other deposition chamber and is set on the substrate supporting mechanism. In addition, the first substrate 957 is fixed to the substrate supporting mechanism so that a surface of the first substrate 957, on which the material layer 958 is formed, faces a deposition target surface of a second substrate 959. Note that although not shown, between the first substrate 957 and the material layer 958, the reflective layer, the light absorption layer, and the heat insulating layer are formed with any structure described in the above embodiment modes.

Next, the supporting substrate is irradiated with light from the light source 960 and is rapidly heated while the distance between the substrates is retained at the distance d. By heating the supporting substrate rapidly, the material layer 958 on the supporting substrate is heated to be sublimed in a short time by indirect heat conduction, and thus an evaporation material is deposited onto the deposition target surface of the second substrate 959 which is the deposition target substrate placed to face the supporting substrate. This makes it possible to realize a small-sized deposition apparatus the capacity of which is drastically smaller than that of a conventional evaporation apparatus which is a large-capacity chamber.

In addition, a plurality of deposition apparatuses described in this embodiment mode may be provided, so that a multi-chamber manufacturing apparatus can be obtained. Needless to say, the deposition apparatus can be combined with a deposition apparatus of another deposition method. In addition, furthermore, a plurality of deposition apparatuses described in this embodiment mode can be disposed in series, so that an in-line manufacturing apparatus can be obtained.

The use of such a deposition apparatus makes it possible to manufacture the light-emitting device of the present invention. According to the present invention, an evaporation source can be easily prepared by a wet method. In addition, because the evaporation source may be evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be made easier.

In addition, application of the present invention facilitates formation of an EL layer included in a light-emitting element, and also facilitates manufacture of a light-emitting device including the light-emitting element. In addition, application of the present invention facilitates patterning of a light-emitting layer; thus, it also facilitates manufacture of a light-emitting device. Further, a fine pattern can be formed; thus, a high-definition light-emitting device can be obtained. Furthermore, application of the present invention makes it possible to use, as a light source, a lamp heater or the like which is inexpensive but provides a large amount of heat can be used instead of a laser device. Accordingly, manufacturing cost of a light-emitting device can be reduced.

Note that this embodiment mode can be combined with any other embodiment mode described in this specification as appropriate.

Embodiment Mode 5

In this embodiment mode, an example of a deposition apparatus which enables manufacture of the light-emitting device of the present invention is described.

FIG. 8 is a perspective view showing an example of a deposition apparatus using a laser. Emitted laser light is output from a laser device 1103 (e.g., a YAG laser device or an excimer laser device); the laser beam is transmitted through a first optical system 1104 for changing the beam shape into a rectangular shape, a second optical system 1105 for shaping the beam, and a third optical system 1106 for collimating the beam; and an optical path of the laser beam is bended to a direction perpendicular to an evaporation donor substrate 1110 by using a reflecting mirror 1107. Then, the evaporation donor substrate is irradiated with the laser beam.

For a reflective layer 1111 including an opening portion, a material which can withstand irradiation with laser light is used.

In addition, the shape of a laser spot with which the evaporation donor substrate is irradiated is preferably rectangular or linear. Specifically, the shape may be a rectangle having a shorter side of 1 to 5 mm and a longer side of 10 to 50 mm. Further, in the case of using a large-area substrate, a laser spot preferably has a longer side of 20 to 100 cm in order to shorten processing time. Moreover, a plurality of laser devices and optical systems shown in FIG. 8 may be provided to process a large-area substrate in a short time. Specifically, laser beams may be emitted from the plurality of laser devices so that the laser beams are used to process separate areas of a substrate.

Note that FIG. 8 shows an example, and there is no particular limitation on positional relationship between each optical system and electro-optical element placed along the path of laser light. For example, a reflective mirror is not necessarily needed if the laser device 1103 is placed above the evaporation donor substrate 1110 so that laser light is emitted from the laser device 1103 in a direction perpendicular to the principle plane of the evaporation donor substrate 1110. Furthermore, each optical system may be a condenser lens, a beam expander, a homogenizer, a polarizer, or the like, and these elements may be used in combination. In addition, as each optical system, a slit may be used in combination with these elements.

By appropriate two-dimensional scanning of an irradiation surface by laser irradiation, a wide area of the substrate is irradiated. In order to perform the scanning, the irradiation region of the laser beam and the substrate are relatively moved. Here, the scanning is performed with a moving means (not shown) for moving a substrate stage 1109 holding the substrate in X and Y directions.

In addition, a control device 1117 is preferably interlocked such that it can also control the moving means for moving the substrate stage 1109 in the X and Y directions. Further, the control device 1117 is preferably interlocked such that it can also control the laser device 1103. Further, the control device 1117 is preferably interlocked with a position alignment mechanism having an image pickup element 1108 for recognizing a position marker.

The position alignment mechanism aligns the evaporation donor substrate 1110 and a deposition target substrate 1100 with each other.

In addition, for the evaporation donor substrate 1110 irradiated with the laser beam, the evaporation donor substrate described in Embodiment Mode 1 is used. The evaporation donor substrate 1110 is provided with the reflective layer 1111, a heat insulating layer 1115, a light absorption layer 1114, and a material layer 1116 which are stacked in that order, and the surface on which these layers are formed is placed so as to face the deposition target substrate 1100. For the light absorption layer 1114, a heat-resistant metal is preferably used, and for example, tungsten, tantalum, or the like is used.

In addition, the evaporation donor substrate 1110 and the deposition target substrate 1100 are disposed close to each other so that the distance d between the evaporation donor substrate 1110 and the deposition target substrate 1100 is greater than or equal to 0 mm and less than or equal to 2 mm, preferably, greater than or equal to 0 mm and less than or equal to 0.05 mm, further preferably, greater than or equal to 0 mm and less than or equal to 0.03 mm. In addition, when the deposition target substrate 1100 is provided with the insulator which serves as a partition wall, the insulator and the material layer 1116 may be disposed in contact with each other.

When deposition is performed using the deposition apparatus shown in FIG. 8, at least the evaporation donor substrate 1110 and the deposition target substrate 1100 are disposed in a vacuum chamber. Alternatively, all of the components shown in FIG. 8 may be placed in a vacuum chamber.

In addition, although FIG. 8 shows an example of the deposition apparatus employing a face-up system in which the deposition surface of the deposition target substrate 1100 faces upward, a deposition apparatus employing a face-down system may be used. In addition, when the deposition target substrate 1100 is a large-area substrate, a so-called vertical placement apparatus may also be employed in which the principal plane of the deposition target substrate 1100 is arranged perpendicular to a horizontal plane in order to suppress distortion of the center of the substrate due to its own weight.

In addition, by providing a cooling means for cooling the deposition target substrate 1100, a flexible substrate such as a plastic substrate can be used as the deposition target substrate 1100.

In addition, a plurality of deposition apparatuses described in this embodiment mode may be provided, so that a multi-chamber manufacturing apparatus can be obtained. Needless to say, the deposition apparatus can be combined with a deposition apparatus of another deposition method. In addition, a plurality of deposition apparatuses described in this embodiment mode can be disposed in series, so that an in-line manufacturing apparatus can be obtained.

The use of such a deposition apparatus makes it possible to manufacture the light-emitting device of the present invention. According to the present invention, an evaporation source can be easily prepared by a wet method. In addition, because the evaporation source may be evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be made easier.

In addition, application of the present invention facilitates formation of an EL layer included in a light-emitting element, and also facilitates manufacture of a light-emitting device including the light-emitting element. In addition, application of the present invention facilitates patterning of a light-emitting layer; thus, it also facilitates manufacture of a light-emitting device. Further, a fine pattern can be formed; thus, a high-definition light-emitting device can be obtained.

Note that this embodiment mode can be combined with any other embodiment mode described in this specification as appropriate.

Embodiment Mode 6

In this embodiment mode, a manufacturing method of a light-emitting element and a light-emitting device by application of the present invention is described.

Figure 9A:
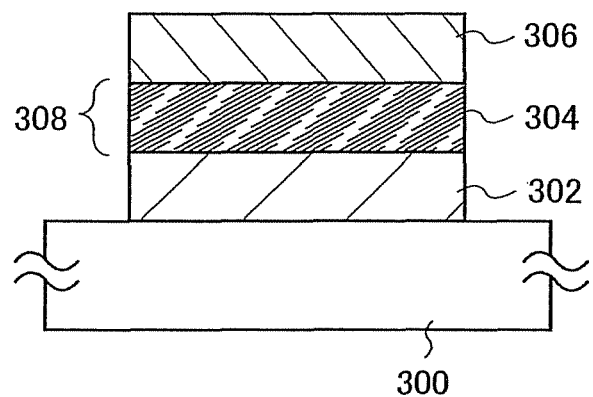
FIGS. 9A and 9B each illustrate an example of a light-emitting element.
Figure 9B:
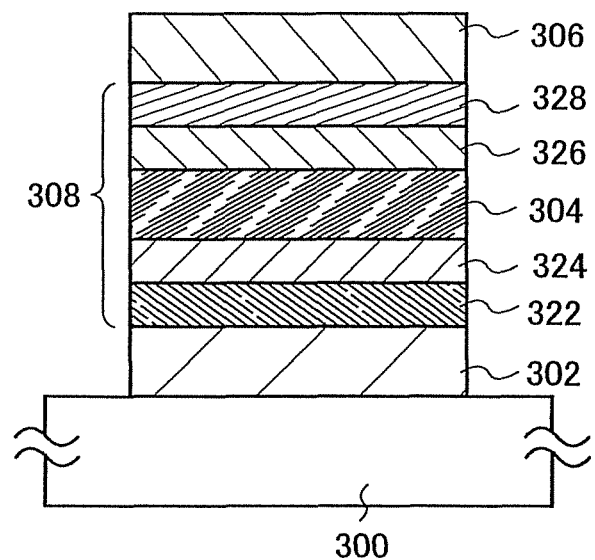

For example, light-emitting elements shown in FIGS. 9A and 9B can be manufactured. In the light-emitting element shown in FIG. 9A, a first electrode layer 302, an EL layer 308 which functions as a light-emitting layer 304, and a second electrode layer 306 are stacked in that order over a substrate 300. One of the first electrode layer 302 and the second electrode layer 306 functions as an anode, and the other functions as a cathode. Holes injected from the anode and electrons injected from the cathode recombine in the light-emitting layer 304, whereby light emission can be obtained. In this embodiment mode, the first electrode layer 302 functions as the anode and the second electrode layer 306 functions as the cathode.

Further, in the light-emitting element shown in FIG. 9B, in addition to the components shown in FIG. 9A, a hole-injecting layer, a hole-transporting layer, an electron-transporting layer, and an electron-injecting layer are provided. The hole-transporting layer is provided between the anode and the light-emitting layer. In addition, the hole-injecting layer is provided between the anode and the light-emitting layer or between the anode and the hole-transporting layer. On the other hand, the electron-transporting layer is provided between the cathode and the light-emitting layer. The electron-injecting layer is provided between the cathode and the light-emitting layer or between the cathode and the electron-transporting layer. Note that not all of the hole-injecting layer, the hole-transporting layer, the electron-transporting layer, and the electron-injecting layer are necessarily provided, and a layer which is to be provided may be selected as appropriate in accordance with a desired function or the like. In FIG. 9B, the first electrode layer 302 which functions as an anode, a hole-injecting layer 322, a hole-transporting layer 324, the light-emitting layer 304, an electron-transporting layer 326, an electron-injecting layer 328 and the second electrode layer 306 which functions as a cathode, are stacked in that order over the substrate 300.

As the substrate 300, a substrate having an insulating surface or an insulating substrate is employed. Specifically, any of a variety of glass substrates used for the electronics industry, such as an aluminosilicate glass substrate, an aluminoborosilicate glass substrate, or a barium borosilicate glass substrate; a quartz substrate; a ceramic substrate; a sapphire substrate; or the like can be used.

For the first electrode layer 302 and the second electrode layer 306, any of various types of metals, alloys, electro-conductive compounds, mixtures thereof, and the like can be used. For example, there are indium tin oxide (ITO), indium tin oxide containing silicon or silicon oxide, indium zinc oxide (IZO), indium oxide containing tungsten oxide and zinc oxide (IWZO), and the like. Films of these conductive metal oxides are generally deposited by sputtering, but they may be formed by application of a sol-gel method or the like. For example, a film of indium zinc oxide (IZO) can be formed by a sputtering method using a target in which 1 to 20 wt % zinc oxide is added to indium oxide. In addition, a film of indium oxide containing tungsten oxide and zinc oxide (IWZO) can be formed by a sputtering method using a target which contains 0.5 to 5 wt % tungsten oxide and 0.1 to 1 wt % zinc oxide with respect to indium oxide. Alternatively, there are gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like. Alternatively, aluminum (Al), silver (Ag), an alloy containing aluminum (e.g., AlSi), or the like can be used. Alternatively, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (e.g., an alloy of aluminum, magnesium, and silver, and an alloy of aluminum and lithium); rare earth metals such as europium (Eu) and ytterbium (Yb), and alloys thereof; and the like. Films of alkali metals, alkaline earth metals, and alloys thereof can be formed by a vacuum evaporation method. Alternatively, films of alkali metals and alkaline earth metals can be formed by a sputtering method. Alternatively, the first electrode layer 302 and the second electrode layer 306 can be formed using a silver paste or the like by an inkjet method or the like. In addition, each of the first electrode layer 302 and the second electrode layer 306 is not limited to a single-layer film and can be formed as a stacked-layer film.

Note that, in order to extract light emitted in the light-emitting layer 304 to the outside, one or both of the first electrode layer 302 and the second electrode layer 306 is/are formed so as to transmit light emitted in the light-emitting layer. For example, one or both of the first electrode layer 302 and the second electrode layer 306 is/are formed using a conductive material having a light-transmitting property, such as indium tin oxide, or formed using silver, aluminum, or the like to a thickness of several nanometers to several tens of nanometers. Alternatively, one or both of the first electrode layer 302 and the second electrode layer 306 can have a stacked-layer structure including a thin film of a metal such as silver, aluminum, or the like with a small thickness and a thin film of a conductive material having a light-transmitting property, such as an ITO film. Note that the first electrode layer 302 or the second electrode layer 306 may be formed by any of various methods.

In this embodiment mode, the light-emitting layer 304, the hole-injecting layer 322, the hole-transporting layer 324, the electron-transporting layer 326, or the electron-injecting layer 328 can be Mimed by application of the deposition method described above in Embodiment Mode 1.

For example, when the light-emitting element shown in FIG. 9A is formed, an evaporation donor substrate which includes a reflective layer including an opening portion, a light absorption layer formed over the reflective layer, a heat insulating layer formed over the reflective layer with the light absorption layer interposed therebetween, and a material layer which serves as an evaporation source for forming a light-emitting layer is disposed close to the substrate 300 provided with the first electrode layer 302. By light irradiation, the material layer provided to the evaporation donor substrate is heated to be sublimed to form the light-emitting layer 304 over the substrate 300. Then, the second electrode layer 306 is formed over the light-emitting layer 304.

Various kinds of materials can be used for the light-emitting layer 304. For example, a fluorescent compound which exhibits fluorescence or a phosphorescent compound which exhibits phosphorescence can be used.

Examples of phosphorescent compounds which can be used for the light-emitting layer are given below. Examples of bluish light-emitting materials include: bis[2-(4',6'-difluorophenyl)pyridinato-N,C$^{2'}$]iridium(III) tetrakis(1-pyrazolyl)borate (abbr.: FIr6); bis[2-(4',6'-difluorophenyl)pyridinato-N,C$^{2'}$]iridium(III) picolinate (abbr.: FIrpic); bis[2-(3',5' bistrifluoromethylphenyl)pyridinato-N,C$^{2'}$]iridium(III) picolinate (abbr.: Ir(CF$_3$ppy)$_2$(pic)); bis[2-(4',6'-difluorophenyl)pyridinato-N,C$^{2'}$]iridium(III) acetylacetonate (abbr.: FIr(acac)); and the like. In addition, examples of greenish light-emitting materials include: tris(2-phenylpyridinato-N,C$^{2'}$)iridium(III) (abbr.: Ir(ppy)$_3$); bis(2-phenylpyridinato-N,C$^{2'}$)iridium(III) acetylacetonate (abbr.: Ir(ppy)$_2$(acac)); bis (1,2-diphenyl-1H-benzimidazolato)iridium(III) acetylacetonate (abbr.: Ir(pbi)$_2$(acac)); bis(benzo[h]quinolinato)iridium(III) acetylacetonate (abbr.: Ir(bzq)$_2$(acac)); and the like. In addition, examples of yellowish light-emitting material include: bis(2,4-diphenyl-1,3-oxazolato-N,C$^{2'}$) iridium(III) acetylacetonate (abbr.: Ir(dpo)$_2$(acac)); bis[2-(4'-perfluorophenylphenyl)pyridinato]iridium(III) acetylacetonate (abbr.: Ir(p-PF-ph)$_2$(acac)); bis(2-phenylbenzothiazolato-N,C$^{2'}$)iridium(III) acetylacetonate (abbr.: Ir(bt)$_2$(acac)); and the like. In addition, examples of orangish light-emitting materials include: tris(2-phenylquinolinato-N,C$^{2'}$)iridium(III) (abbr.: Ir(pq)$_3$); bis(2-phenylquinolinato-N,C$^{2'}$)iridium(III) acetylacetonate (abbr.: Ir(pq)$_2$ (acac)); and the like. In addition, examples of reddish light-emitting materials include organic metal complexes, such as bis[2-(2'-benzo[4,5-m]thienyl)pyridinato-N,C$^{3'}$] iridium(III) acetylacetonate (abbr.: Ir(btp)$_2$(acac)), bis(1-phenylisoquinolinato-N,C$^{2'}$)iridium(III) acetylacetonate (abbr.: Ir(piq)$_2$(acac)), (acetylacetonato)bis[2,3-bis(4-fluorophenyl)quinoxalinato]iridium(III) (abbr.: Ir(Fdpq)$_2$ (acac)), and 2,3,7,8,12,13,17,18-octaethyl-21H,23H-porphyrin platinum(II) (abbr.: PtOEP). In addition, rare-earth metal complexes, such as tris(acetylacetonato)(monophenanthroline)terbium(III) (abbr.: Tb(acac)$_3$(Phen)), tris(1, 3-diphenyl-1,3-propanedionato)(monophenanthroline)europium(III) (abbr.: Eu(DBM)$_3$(Phen)), and tris[1-(2-thenoyl)-3,3,3-trifluoroacetonato](monophenanthroline)europium (III) (abbr.: Eu(TTA)$_3$(Phen)), exhibit light emission from rare-earth metal ions (electron transition between different multiplicities); thus, rare-earth metal complexes can be used as phosphorescent compounds.

Examples of fluorescent compounds which can be used for the light-emitting layer are given below. Examples of bluish light-emitting materials include: N,N-bis[4-(9H-carbazol-9-yl)phenyl]-N,N'-diphenylstilbene-4,4'-diamine (abbr.: YGA2S); 4-(9H-carbazol-9-yl)-4'-(10-phenyl-9-anthryl)triphenylamine (abbr.: YGAPA); and the like. In addition, examples of greenish light-emitting materials include: N-(9,10-diphenyl-2-anthryl)-N,9-diphenyl-9H-carbazol-3-amine (abbr.: 2PCAPA); N-[9,10-bis(1,1'-biphenyl-2-yl)-2-anthryl]-N,9-diphenyl-9H-carbazol-3-amine (abbr.: 2PCABPbA); N-(9,10-diphenyl-2-anthryl)-N,N',N'-triphenyl-1,4-phenylenediamine (abbr.: 2DPAPA); N-[9,10-bis (1,1'-biphenyl-2-yl)-2-anthryl]-N,N',N'-triphenyl-1,4-phenylenediamine (abbr.: 2DPABPhA); 9,10-bis(1,1'-biphenyl-2-yl)-N-[4-(9H-carbazol-9-yl)phenyl]-N-phenylanthracen-2-amine (abbr.: 2YGABPhA); N,N,9-triphenylanthracen-9-amine (abbr.: DPhAPhA); and the like. In addition, examples of yellowish light-emitting materials include: rubrene; 5,12-bis(1,1'-biphenyl-4-yl)-6,11-diphenyltetracene (abbr.: BPT); and the like. In addition, examples of reddish light-emitting materials include: N,N,N',N'-tetrakis (4-methylphenyl)tetracene-5,11-diamine (abbr.: p-mPhTD); 7,13-diphenyl-N,N,N',N'-tetrakis(4-methylphenyl)acenaphtho[1,2-a]fluoranthene-3,10-diamine (abbr.: p-mPhAFD); and the like.

Alternatively, the light-emitting layer 304 can also have a structure in which a substance having a high light-emitting property (a dopant material) is dispersed in another substance (a host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having singlet excitation energy (the energy difference between a ground state and a singlet excited state) higher than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer include: 4,4'-bis[N-(1-naphthyl)-N-phenylamino]biphenyl (abbr.: NPB); tris(8-quinolinolato)aluminum(III) (abbr.: Alq); 4,4'-bis[N-(9,9-dimethylfluoren-2-yl)-N-phenylamino]biphenyl (abbr.: DFLDPBi); bis(2-methyl-8-quinolinolato)(4-phenylphenolato)aluminum(III) (abbr.: BAlq); 4,4'-di(9-carbazolyl)biphenyl (abbr.: CBP); 2-tert-butyl-9,10-di(2-naphthyl)anthracene (abbr.: t-BuDNA); 9-[4-(9-carbazolyl)phenyl]-10-phenylanthracene (abbr.: CzPA); and the like.

In addition, as the dopant material, any of the above-mentioned phosphorescent compounds and fluorescent compounds can be used.

When the light-emitting layer has a structure in which a substance having a high light-emitting property (a dopant material) is dispersed in another substance (a host material), a mixed layer of a host material and a guest material is formed as the material layer which serves as an evaporation source. Alternatively, the material layer which serves as an evaporation source may have a structure in which a layer containing a host material and a layer containing a dopant material are stacked. By faulting the light-emitting layer using an evaporation source having such a structure, the light-emitting layer 304 contains a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that, for the light-emitting layer, two or more kinds of host materials and a dopant material may be used, or two or more kinds of dopant materials and a host material may be used. Alternatively, two or more kinds of host materials and two or more kinds of dopant materials may be used.

In addition, in the case where the light-emitting element shown in FIG. 9B, in which various functional layers are stacked, is formed, the following procedure may be repeated: a material layer is formed over a supporting substrate including a reflective layer, a light absorption layer, and a heat insulating layer; the supporting substrate is disposed close to a deposition target substrate; the material layer formed over the supporting substrate is heated to be sublimed, thereby forming a functional layer over the deposition target substrate. For example, a material layer which serves as an evaporation source for forming a hole-injecting layer is formed over a supporting substrate; the supporting substrate is disposed close to a deposition target substrate; and the material layer formed over the supporting substrate is heated to be sublimed, thereby forming the hole-injecting layer 322 over the deposition target substrate. The deposition target substrate here is the substrate 300 and is provided with the first electrode layer 302 in advance. Successively, a material layer which serves as an evaporation source for forming a hole-transporting layer is formed over a supporting substrate; the supporting substrate is disposed close to the deposition target substrate; and the material layer formed over the supporting substrate is heated to be sublimed, thereby forming the hole-transporting layer 324 over the hole-injecting layer 322 over the deposition target substrate.

After that, the light-emitting layer 304, the electron-transporting layer 326, and the electron-injecting layer 328 are sequentially stacked in a similar manner, and then the second electrode layer 306 is formed.

The hole-injecting layer 322, the hole-transporting layer 324, the electron-transporting layer 326, or the electron-injecting layer 328 may be formed using various EL materials. Each layer may be formed using one kind of material or a composite material of plural kinds of materials. In the case where a layer is formed using a composite material, a material layer containing plural kinds of evaporation materials is formed as described above. Alternatively, a material layer is formed by stacking a plurality of material layers. Also in the case where a layer is formed using one kind of material, the deposition method described above in Embodiment Mode 1 can be applied. Moreover, each of the hole-injecting layer 322, the hole-transporting layer 324, the electron-transporting layer 326, and the electron-injecting layer 328 may have a single-layer structure or a stacked-layer structure. For example, the hole-transporting layer 324 may have a stacked-layer structure of a first hole-transporting layer and a second hole-transporting layer. In addition, the electrode layer can also be formed by the deposition method described in Embodiment Mode 1.

For example, the hole-injecting layer 322 can be formed using molybdenum oxide, vanadium oxide, ruthenium oxide, tungsten oxide, manganese oxide, or the like. Alternatively, the hole-injecting layer can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesulfonic acid) (PEDOT/PSS), or the like.

Alternatively, as the hole-injecting layer 322, a layer which contains a substance having a high hole-transporting property and a substance having an electron accepting property can be used. The layer which contains a substance having a high hole-transporting property and a substance having an electron accepting property has high carrier density and an excellent hole-injecting property. When the layer which contains a substance having a high hole-transporting property and a substance having an electron accepting property is used as a hole-injecting layer in contact with an electrode which functions as an anode, any of various kinds of metals, alloys, electroconductive compounds, mixtures thereof, and the like can be used for the electrode layer regardless of the magnitude of work function of a material of the electrode layer which functions as an anode.

The layer which contains a substance having a high hole-transporting property and a substance having an electron accepting property can be formed using, for example, a stack of a layer which contains a substance having a high hole-transporting property and a layer which contains a substance having an electron accepting property as an evaporation source.

As the substance having an electron accepting property, which is used for the hole-injecting layer, there are 7,7,8,8-tetracyano-2,3,5,6-tetrafluoroquinodimethane (abbr.: $F_4$-TCNQ), chloranil, and the like. In addition, there are transition metal oxides. In addition, there are oxides of metals belonging to Groups 4 to 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole-transporting property, which is used for the hole-injecting layer, any of various compounds such as aromatic amine compounds, carbazole derivatives, aromatic hydrocarbons, and high molecular compounds (such as oligomers, dendrimers, and polymers) can be used. Note that the substance having a high hole-transporting property, which is used for the hole-injecting layer, is preferably a substance having a hole mobility of $10^{-6}$ cm$^2$/Vs or more. Note that any substance other than the above substances may be used as long as it is a substance in which the hole-transporting property is higher than the electron-transporting property. Specific examples of the substance having a high hole-transporting property, which can be used for the hole-injecting layer, are given below.

Examples of aromatic amine compounds which can be used for the hole-injecting layer include: 4,4'-bis[N-(1-naphthyl)-N-phenylamino]biphenyl (abbr.: NPB); N,N'-bis(3-methylphenyl)-N,N'-diphenyl-[1,1'-biphenyl]-4,4'-diamine (abbr.: TPD); 4,4',4''-tris(N,N-diphenylamino)triphenylamine (abbr.: TDATA); 4,4',4''-tris[N-(3-methylphenyl)-N-phenylamino]triphenylamine (abbr.: MTDATA); 4,4'-bis[N-(spiro-9,9'-bifluoren-2-yl)-N-phenylamino]biphenyl (abbr.: BSPB); and the like. Other examples are as follows: N,N-bis(4-methylphenyl)(p-tolyl)-N,N-diphenyl-p-phenylenediamine (abbr.: DTDPPA); 4,4'-bis[N-(4-diphenylaminophenyl)-N-phenylamino]biphenyl (abbr.: DPAB); 4,4'-bis(N-{4-[N'-(3-methylphenyl)-N'-phenylamino]phenyl}-N-phenylamino)biphenyl (abbr.: DNTPD); 1,3,5-tris[N-(4-diphenylaminophenyl)-N-phenylamino]benzene (abbr.: DPA3B); and the like.

Specific examples of carbazole derivatives which can be used for the hole-injecting layer include: 3-[N-(9-phenylcarbazol-3-yl)-N-phenylamino]-9-phenylcarbazole (abbr.: PCzPCA1); 3,6-bis[N-(9-phenylcarbazol-3-yl)-N-phenylamino]-9-phenylcarbazole (abbr.: PCzPCA2); 3-[N-(1-naphthyl)-N-(9-phenylcarbazol-3-yl)amino]-9-phenylcarbazole (abbr.: PCzPCN1); and the like.

In addition, other examples of carbazole derivatives which can be used for the hole-injecting layer include: 4,4'-di(N-carbazolyl)biphenyl (abbr.: CBP); 1,3,5-tris[4-(N-carbazolyl)phenyl]benzene (abbr.: TCPB); 9-[4-(10-phenyl-9-anthryl)phenyl]-9H-carbazole (abbr.: CzPA); 1,4-bis[4-(N-carbazolyl)phenyl]-2,3,5,6-tetraphenylbenzene; and the like.

In addition, examples of aromatic hydrocarbons which can be used for the hole-injecting layer include: 2-tert-butyl-9,10-di(2-naphthyl)anthracene (abbr.: t-BuDNA); 2-tert-butyl-9,10-di(1-naphthyl)anthracene; 9,10-bis(3,5-diphenylphenyl)anthracene (abbr.: DPPA); 2-tert-butyl-9,10-bis(4-phenylphenyl)anthracene (abbr.: t-BuDBA); 9,10-di(2-naphthyl)anthracene (abbr.: DNA); 9,10-diphenylanthracene (abbr.: DPAnth); 2-tert-butylanthracene (abbr.: t-BuAnth); 9,10-bis(4-methyl-1-naphthyl)anthracene (abbr.: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Alternatively, pentacene, coronene, or the like can also be used. As these aromatic hydrocarbons listed here, an aromatic hydrocarbon having a hole mobility of $1 \times 10^{-6}$ cm$^2$/Vs or more and having 14 to 42 carbon atoms is preferably used.

Note that an aromatic hydrocarbon which can be used for the hole-injecting layer may have a vinyl skeleton. Examples of aromatic hydrocarbons having a vinyl group include: 4,4'-bis(2,2-diphenylvinyl)biphenyl (abbr.: DPVBi); 9,10-bis[4-(2,2-diphenylvinyl)phenyl]anthracene (abbr.: DPVPA); and the like.

The hole-injecting layer can be formed by using an evaporation source in which the layer which contains a substance having a high hole-transporting property and the layer which contains a substance having an electron accepting property are stacked. When a metal oxide is used as the substance having an electron accepting property, it is preferable that a layer which contains a metal oxide be formed after the layer which contains a substance having a high hole-transporting property be formed over a first substrate. This is because, in many cases, a metal oxide has higher decomposition temperature or evaporation temperature than a substance having a high hole-transporting property. The evaporation source with such a structure makes it possible to efficiently sublime a substance having a high hole-transporting property and a metal oxide. In addition, local non-uniformity of the concentration in a film formed by evaporation can be suppressed. Moreover, there are few kinds of solvents which allow both a substance having a high hole-transporting property and a metal oxide to be dissolved or dispersed therein, and a mixed solution is not easily formed. Therefore, it is difficult to directly form a mixed layer by a wet method. However, the use of the deposition method of the present invention makes it possible to easily form a mixed layer which contains a substance having a high hole-transporting property and a metal oxide.

In addition, the layer which contains a substance having a high hole-transporting property and a substance having an electron accepting property is excellent in not only a hole-injecting property but also a hole-transporting property, and thus the above-described hole-injecting layer may be used as the hole-transporting layer.

In addition, the hole-transporting layer 324 is a layer which contains a substance having a high hole-transporting property. Examples of the substance having a high hole-transporting property include aromatic amine compounds such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. The substances listed here mainly have a hole mobility of $1 \times 10^{-6}$ cm$^2$/Vs or more. Note that any substance other than the above substances may be used as long as it is a substance in which the hole-transporting property is higher than the electron-transporting property. Further, the layer which contains a substance having a high hole-transporting property is not limited to a single layer and may be a stacked layer of two or more layers formed of the above-mentioned substances.

The electron-transporting layer 326 is a layer which contains a substance having a high electron-transporting property. Examples of the substance having a high electron-transporting property include metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), bis(2- methyl-8-quinolinolato)(4-phenylphenolato)aluminum (abbr.: BAlq), and the like. Other examples are metal complexes having an oxazole-based ligand or a thiazole-based ligand, such as bis[2-(2-hydroxyphenyl)benzoxazolato]zinc (abbr.: $Zn(BOX)_2$), bis[2-(2-hydroxyphenyl)benzothiazolato]zinc (abbr.: $Zn(BTZ)_2$), and the like. Besides metal complexes, other examples are as follows: 2-(4-biphenylyl)-5-(4-tert-butylphenyl)-1,3,4-oxadiazole (abbr.: PBD); 1,3-bis[5-(p-tert-butylphenyl)-1,3,4-oxadiazol-2-yl] benzene (abbr.: OXD-7); 3-(4-biphenylyl)-4-phenyl-5-(4-tert-butylphenyl)-1,2,4-triazole (abbr.: TAZ01); bathophenanthroline (abbr.: BPhen); bathocuproine (abbr.: BCP); and the like. The substances listed here mainly have an electron mobility of $1\times10^{-6}$ cm$^2$/Vs or more. Note that any substance other than the above substances may be used as long as it is a substance in which the electron-transporting property is higher than the hole-transporting property. In addition, the electron-transporting layer is not limited to a single layer and may be a stacked layer of two or more layers formed of the above-mentioned substances.

In addition, the electron-injecting layer 328 can be formed using an alkali metal compound or an alkaline earth metal compound, such as lithium fluoride (LiF), cesium fluoride (CsF), or calcium fluoride ($CaF_2$). Furthermore, a layer, in which a substance having an electron-transporting property is combined with an alkali metal or an alkaline earth metal, can be employed. For example, a layer of Alq containing magnesium (Mg) can be used. Note that it is preferable that the layer, in which a substance having an electron-transporting property is combined with an alkali metal or an alkaline earth metal, be used as the electron-injecting layer because electrons are efficiently injected from the second electrode layer 306.

Note that there is no particular limitation on a stack structure of layers of the EL layer 308. The EL layer 308 may be formed by an appropriate combination of a light-emitting layer with any of layers which contain a substance having a high electron-transporting property, a substance having a high hole-transporting property, a substance having a high electron-injecting property, a substance having a high hole-injecting property, a bipolar substance (a substance having high electron and hole-transporting properties), and the like.

Emitted light is extracted to the outside through one or both of the first electrode layer 302 and the second electrode layer 306. Therefore, one or both of the first electrode layer 302 and the second electrode layer 306 is/are an electrode having a light transmitting property. In the case where only the first electrode layer 302 is an electrode having a light transmitting property, light is extracted from the substrate 300 side through the first electrode layer 302. Alternatively, in the case where only the second electrode layer 306 is an electrode having a light transmitting property, light is extracted from the side opposite to the substrate 300 side through the second electrode layer 306. In the case where both the first electrode layer 302 and the second electrode layer 306 are electrodes having light transmitting properties, light is extracted from both the substrate 300 side and the side opposite to the substrate 300 side through the first electrode layer 302 and the second electrode layer 306.

Figure 10A:
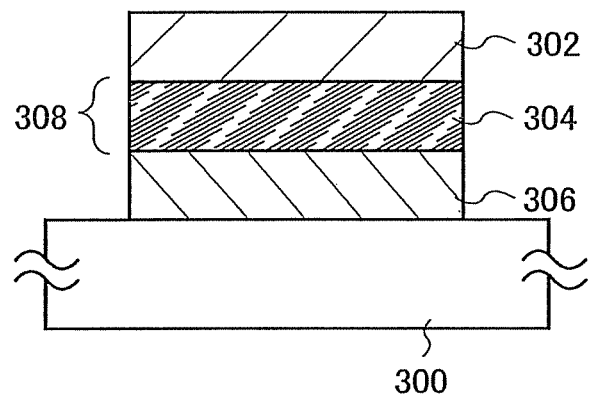
FIGS. 10A and 10B each illustrate an example of a light-emitting element.

Note that, although FIGS. 9A and 9B each show the structure in which the first electrode layer 302 functioning as an anode is provided on the substrate 300 side, a structure may be employed in which the second electrode layer 306 functioning as a cathode, the EL layer 308, and the first electrode layer 302 functioning as an anode are stacked in that order over the substrate 300, as shown in FIG. 10A.

Figure 10B:
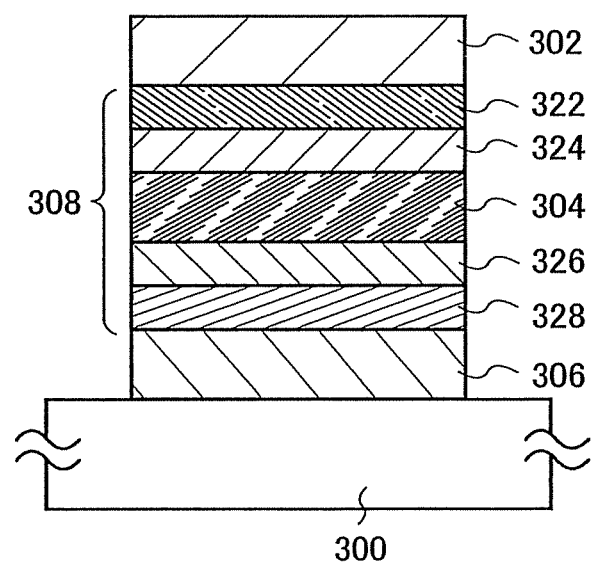

Alternatively, a structure may be employed in which the second electrode layer 306 functioning as a cathode, the electron-injecting layer 328, the electron-transporting layer 326, the light-emitting layer 304, the hole-transporting layer 324, the hole-injecting layer 322, and the first electrode layer 302 functioning as an anode are stacked in that order over the substrate 300, as shown in FIG. 10B.

In addition, the EL layer is formed by the deposition method described in Embodiment Mode 1 or 2 or may be formed by a combination of the deposition method described in Embodiment Mode 1 or 2 with another deposition method. In addition, the electrodes and the layers may be formed by different methods. Examples of a dry method include a vacuum evaporation method, an electron beam evaporation method, a sputtering method, and the like. Examples of a wet method include an inkjet method, a spin coating method, and the like.

Through the above-described steps, the light-emitting element can be manufactured. As for the light-emitting element of this embodiment mode, application of the present invention makes it easy to form functional layers including the light-emitting layer. Then, a light-emitting device can be manufactured by application of such a light-emitting element. An example of a passive-matrix light-emitting device manufactured by application of the present invention is described using FIGS. 11A to 11C, FIG. 12, and FIG. 13.

In a passive-matrix (also called simple-matrix) light-emitting device, a plurality of anodes arranged in stripes (in a strip form) is provided so as to be perpendicular to a plurality of cathodes arranged in stripes. A light-emitting layer is interposed at each intersection. Therefore, a pixel at the intersection of the selected anode (to which voltage is applied) and the selected cathode emits light.

Figure 11A:
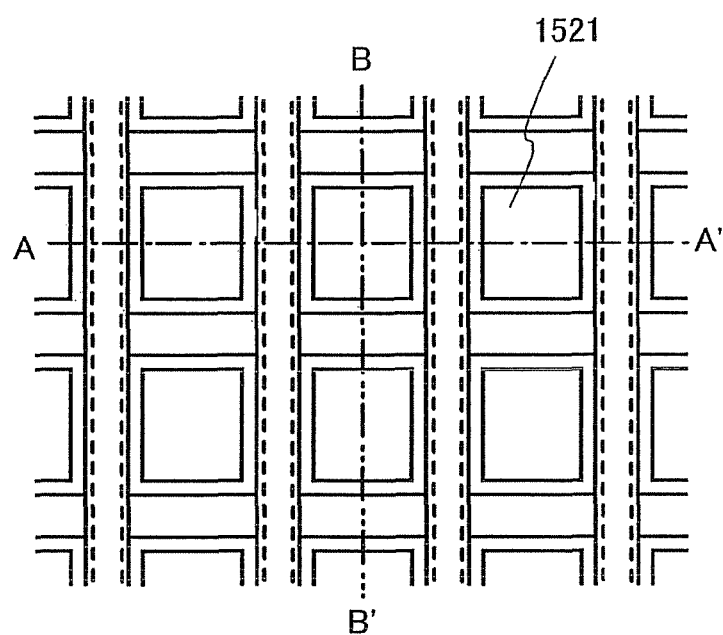
FIG. 11A is a top view of an example of a passive-matrix light-emitting device and FIGS. 11B and 11C are cross-sectional views of FIG. 11A.
Figure 11C:
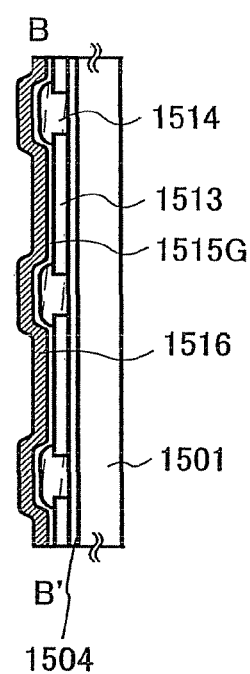
Figure 11B:
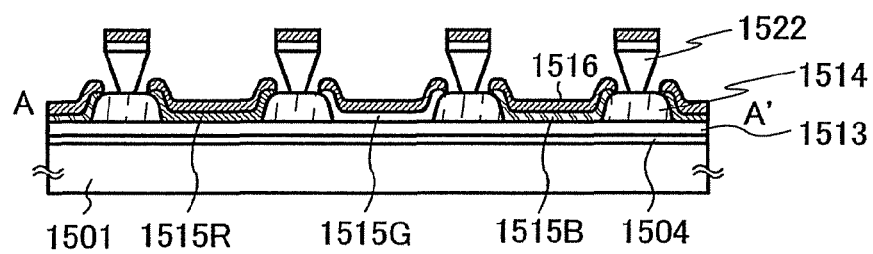

FIG. 11A is a top view of a pixel portion before sealing. FIG. 11B is a cross-sectional view taken along a dashed line A-A' in FIG. 11A. FIG. 11C is a cross-sectional view taken along a dashed line B-B'.

Over a substrate 1501, an insulating layer 1504 is formed as a base insulating layer. Note that the insulating layer 1504 does not necessarily need to be formed if a base insulating layer is not necessary. Over the insulating layer 1504, a plurality of first electrode layers 1513 is arranged in stripes at regular intervals. In addition, over the first electrode layers 1513, a partition wall 1514 having an opening portion corresponding to the pixel is provided. The partition wall 1514 having the opening portion is formed using an insulating material (a photosensitive or nonphotosensitive organic material (polyimide, acrylic, polyimide, polyimide amide, a resist, or benzocyclobutene) or an SOG film (e.g., a silicon oxide film including an alkyl group)). Note that the opening portion corresponding to the pixel is a light-emitting region 1521.

Over the partition wall 1514 having the opening portion, a plurality of inversely tapered partition walls 1522 parallel to each other is provided to intersect with the first electrode layers 1513. The inversely tapered partition walls 1522 are formed by a photolithography method using a positive-type photosensitive resin, of which portion unexposed to light remains as a pattern, and by adjusting the amount of light exposure or the length of development time, so that a lower portion of the pattern is etched more.

Figure 12:
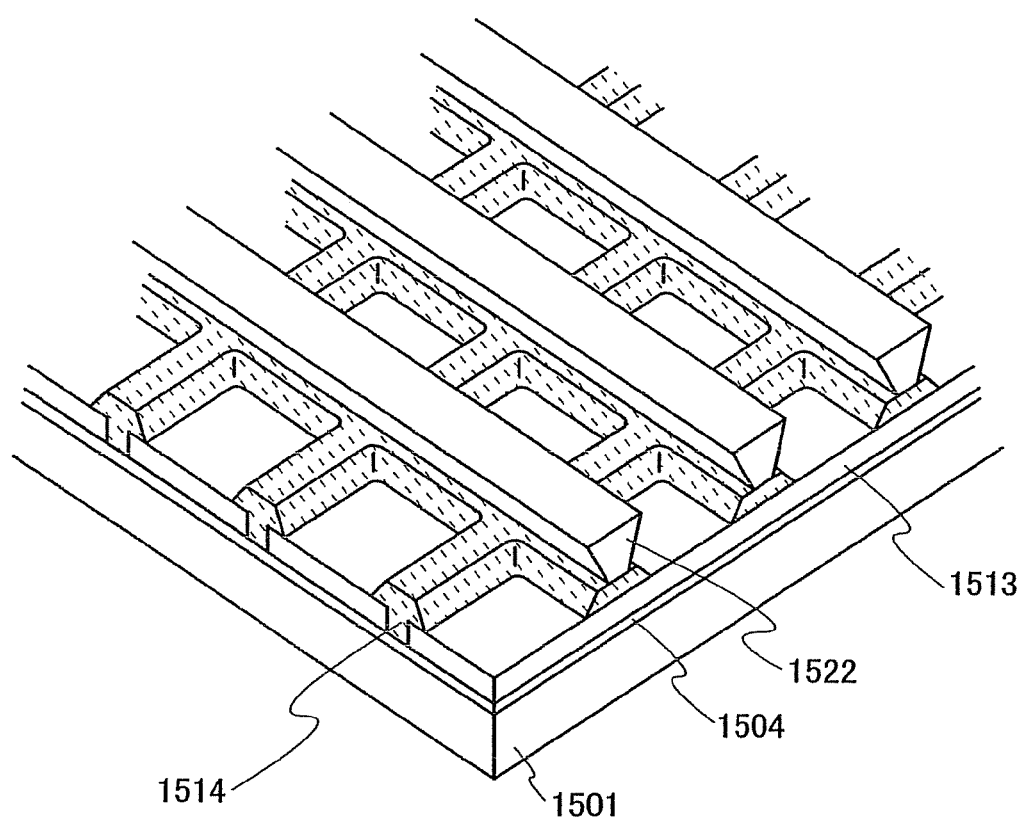
FIG. 12 is a perspective view of the example of the passive-matrix light-emitting device.

In addition, FIG. 12 is a perspective view immediately after the plurality of inversely tapered partition walls 1522 parallel to each other is formed. Note that the same reference numerals are used to denote the same portions as those in FIGS. 11A to 11C.

The total thickness of the partition wall 1514 having the opening portion and each of the inversely tapered partition walls 1522 is set to be larger than the total thickness of the EL layer including the light-emitting layer and a conductive layer serving as the second electrode layer. When the EL layer including the light-emitting layer and the conductive layer are stacked over the substrate having the structure shown in FIG. 12, they are separated into a plurality of regions, so that EL layers 1515R, 1515G and 1515B including the light-emitting layers, and second electrode layers 1516 are formed as shown in FIGS. 11A to 11C. Note that the plurality of separated regions is electrically isolated from each other. The second electrode layers 1516 are electrodes in stripes, which are parallel to each other and extended along a direction intersecting with the first electrode layers 1513. Note that although the EL layers including the light-emitting layers and the conductive layers are also formed over the inversely tapered partition walls 1522, they are separated from the EL layers 1515R, 1515G, and 1515B including the light-emitting layers and the second electrode layers 1516. Note that in this embodiment mode, the EL layer is a layer including at least the light-emitting layer and may include the hole-injecting layer, the hole-transporting layer, the electron-transporting layer, the electron-injecting layer, or the like in addition to the light-emitting layer.

Here, an example is described in which the EL layers 1515R, 1515G, and 1515B including the light-emitting layers are selectively formed and thus a light-emitting device which provides three kinds of light emission (R, G, B) and is capable of performing full color display is formed. The EL layers 1515R, 1515G, and 1515B including the light-emitting layers are formed in a pattern of stripes parallel to each other. These EL layers may be formed by the deposition method described in Embodiment Modes 1 or 2. For example, a first supporting substrate provided with an evaporation source for a light-emitting layer providing red light emission, a second supporting substrate provided with an evaporation source for a light-emitting layer providing green light emission, and a third supporting substrate provided with an evaporation source for a light-emitting layer providing blue light emission are separately prepared. In addition, a substrate provided with the first electrode layers 1513 is prepared as the deposition target substrate. Then, one of the first to third supporting substrates is appropriately disposed to face the deposition target substrate, and the evaporation source formed over the supporting substrate is heated to be sublimed, thereby forming the EL layers including the light-emitting layers over the deposition target substrate.

Further, if necessary, sealing is performed using a sealant such as a sealant can or a glass substrate for sealing. Here, a glass substrate is used as a sealing substrate, and a substrate and the sealing substrate are attached to each other with an adhesive material such as a sealing material to seal a space surrounded by the adhesive material such as a sealing material. The space that is sealed is filled with a filler or a dry inert gas. In addition, a desiccant or the like may be put between the substrate and the sealing material in order to increase reliability of the light-emitting device. A small amount of moisture is removed by the desiccant, whereby sufficient drying is performed. In addition, the desiccant may be a substance that absorbs moisture by chemical adsorption, for example, an oxide of an alkaline earth metal, such as calcium oxide or barium oxide. Note that a substance that adsorbs moisture by physical adsorption, such as zeolite or silica gel, may alternatively be used.

Note that, if the sealant which covers and is in contact with the light-emitting element is provided to sufficiently block the outside air, the desiccant is not necessarily provided.

Figure 13:
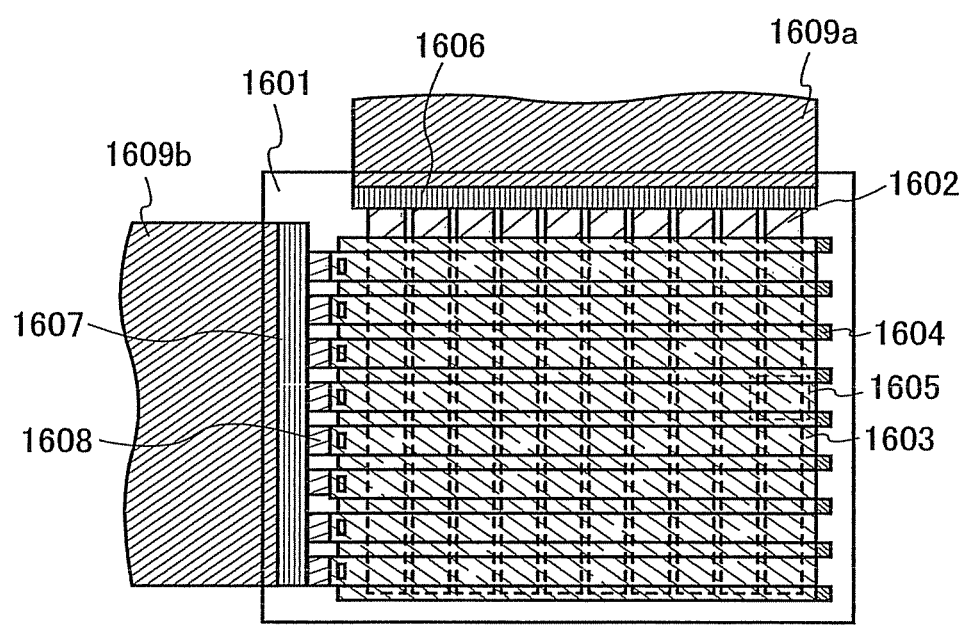
FIG. 13 is a top view of an example of a passive-matrix light-emitting device.

Next, FIG. 13 is a top view of a light-emitting module mounted with an FPC or the like.

Note that the light-emitting device in this specification refers to an image display device, a light-emitting device, or a light source (including a lighting apparatus). Further, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted by a chip-on-glass (COG) method on a substrate provided with a light-emitting element.

In the pixel portion for displaying images, scan lines and data lines intersect with each other perpendicularly as shown in FIG. 13.

The first electrode layers 1513 in FIGS. 11A to 11C correspond to scan lines 1603 in FIG. 13; the second electrode layers 1516 correspond to data lines 1602; and the inversely tapered partition walls 1522 correspond to partition walls 1604; and the substrate 1501 corresponds to the substrate 1601. The EL layers including the light-emitting layers are sandwiched between the data lines 1602 and the scan lines 1603, and an intersection portion indicated by a region 1605 corresponds to one pixel.

Note that the scan lines 1603 are electrically connected at their ends to connection wirings 1608, and the connection wirings 1608 are connected to an FPC 1609b through an input terminal 1607. In addition, the data lines 1602 are connected to an FPC 1609a through an input terminal 1606.

In addition, if necessary, a polarizing plate, a circularly polarizing plate (including an elliptically polarizing plate), a retardation plate (a quarter-wave plate or a half-wave plate), or an optical film such as a color filter may be provided over an emission surface as appropriate. Further, the polarizing plate or the circularly polarizing plate may be provided with an anti-reflection film. For example, anti-glare treatment may be carried out by which reflected light can be diffused by projections and depressions on the surface so as to reduce the glare.

In the above-described manner, a passive-matrix light-emitting device can be manufactured. Application of the present invention makes it easy to form an EL layer included in a light-emitting element and to manufacture a light-emitting device including the light-emitting element. In addition, less complicated control is needed in the case where a light-emitting layer in which a dopant material is dispersed in a host material is formed than in the case where co-evaporation is employed. Moreover, because the additive amount of a dopant material, or the like can be easily controlled, deposition can be performed easily and precisely, and therefore a desired emission color can also be obtained easily. Furthermore, use efficiency of an evaporation material can be increased; thus, cost can be reduced.

In addition, application of the present invention facilitates patterning of a light-emitting layer; thus, it also facilitates manufacture of a light-emitting device. Further, a fine pattern can be formed; thus, a high-definition light-emitting device can be obtained. Furthermore, application of the present invention makes it possible to use, as a light source, a lamp heater or the like which is inexpensive but provides a large amount of heat can be used instead of a laser device. Accordingly, manufacturing cost of a light-emitting device can be reduced.

In addition, although FIG. 13 shows the example in which a driver circuit is not provided over the substrate, the present invention is not particularly limited to this example and an IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. The mounting may be performed using TCP or a wire bonding method other than the COG method. TCP is a TAB tape mounted with an IC, and the TAB tape is connected to a wiring over an element-forming substrate, thereby mounting the IC. Each of the data line side IC and the scan line side IC may be formed using a silicon substrate. Alternatively, it may be that in which a driver circuit is formed using TFTs over a glass substrate, a quartz substrate, or a plastic substrate. In addition, although described here is an example in which a single IC is provided on one side, a plurality of ICs may be provided on one side.

Figure 14A:
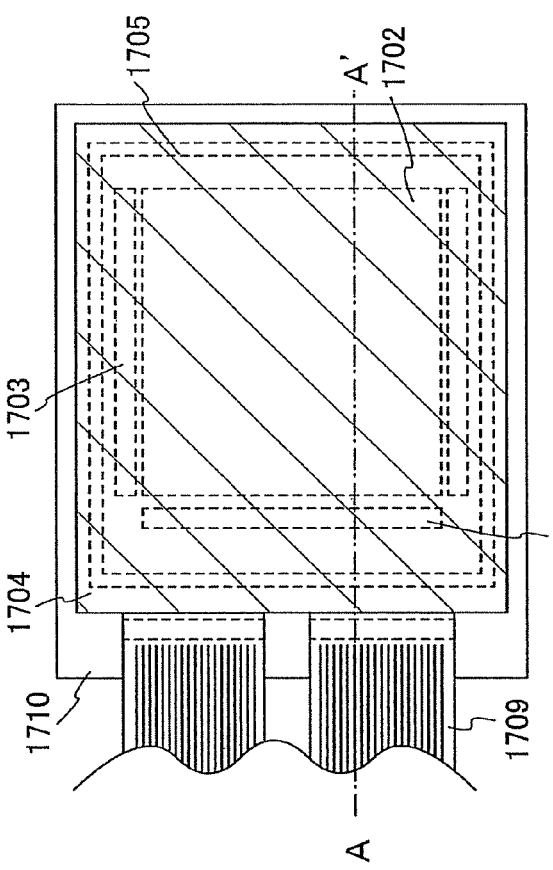
FIG. 14A is a top view of an active-matrix light-emitting device and FIG. 14B is a cross-sectional view of FIG. 14A.
Figure 14B:
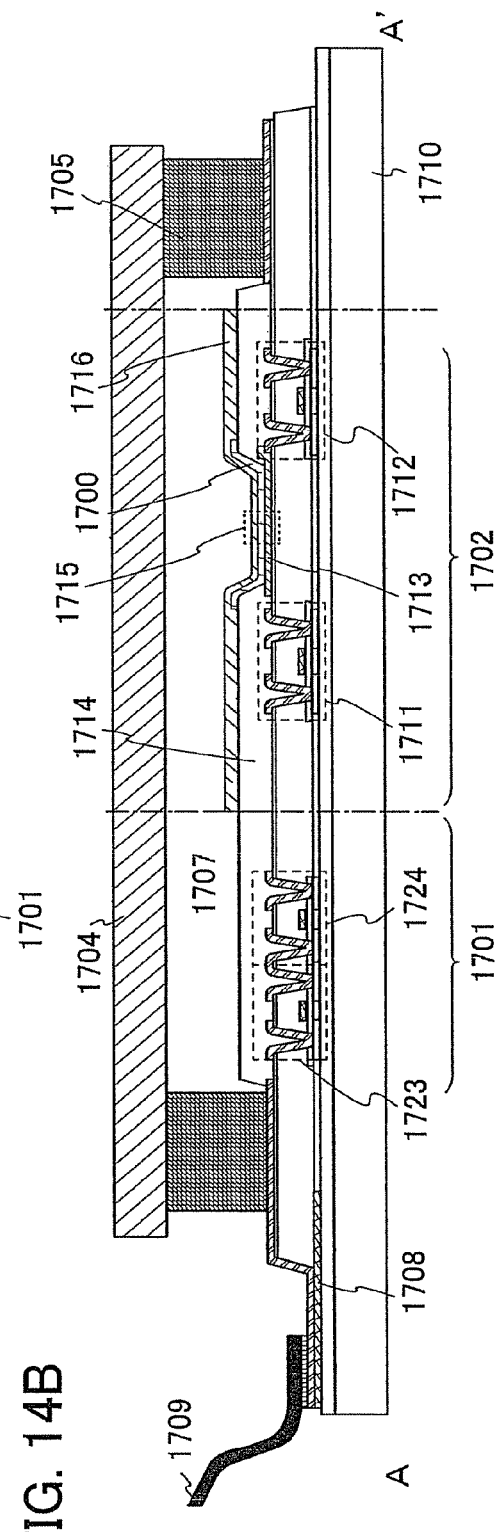

Next, an example of an active-matrix light-emitting device manufactured by application of the present invention is described using FIGS. 14A and 14B. Note that FIG. 14A is a top view showing a light-emitting device and FIG. 14B is a cross-sectional view taken along a chain line A-A' in FIG. 14A. The active-matrix light-emitting device of this embodiment mode includes a pixel portion 1702, a driver circuit portion (a source-side driver circuit) 1701, and a driver circuit portion (a gate-side driver circuit) 1703 provided over an element substrate 1710. The pixel portion 1702, the driver circuit portion 1701, and the driver circuit portion 1703 are sealed, with a sealant 1705, between the element substrate 1710 and a sealing substrate 1704.

In addition, over the element substrate 1710, a lead wiring 1708 for connecting an external input terminal, through which a signal (e.g., a video signal, a clock signal, a start signal, a reset signal, or the like) or an electric potential is transmitted to the driver circuit portion 1701 and the driver circuit portion 1703, is provided. Here, an example is described in which a flexible printed circuit (FPC) 1709 is provided as the external input terminal. Note that only the FPC is shown here; however, the FPC may be provided with a printed wiring board (PWB). The light-emitting device in this specification includes not only the main body of the light-emitting device, but also the light-emitting device with an FPC or a PWB attached thereto.

Next, a cross-sectional structure is described using FIG. 14B. Although the driver circuit portions and the pixel portion are formed over the element substrate 1710, the pixel portion 1702 and the driver circuit portion 1701 which is the source-side driver circuit are shown here.

An example is shown in which a CMOS circuit that is a combination of an n-channel TFT 1723 and a p-channel TFT 1724 is formed as the driver circuit portion 1701. Note that a circuit included in the driver circuit portion may be formed using various CMOS circuits, PMOS circuits, or NMOS circuits. In addition, although a driver-integrated type in which a driver circuit is formed over a substrate is shown in this embodiment mode, it is not necessarily required to have the structure and a driver circuit can be formed not on but outside the substrate.

In addition, the pixel portion 1702 includes a plurality of pixels, each of which includes a switching TFT 1711, a current-controlling TFT 1712, and a first electrode layer 1713 which is electrically connected to a wiring (a source electrode or a drain electrode) of the current-controlling TFT 1712. Note that an insulator 1714 is formed to cover an end portion of the first electrode layer 1713. Here, the insulator 1714 is formed by using a positive photosensitive acrylic resin.

In addition, in order to obtain favorable coverage by a film which is to be stacked over the insulator 1714, the insulator 1714 is preferably formed so as to have a curved surface with curvature at an upper end portion or a lower end portion thereof. For example, in the case of using a positive photosensitive acrylic resin as a material for the insulator 1714, the insulator 1714 is preferably formed so as to have a curved surface with a curvature radius (0.2 to 3 μm) at the upper end portion thereof. In addition, either a negative photosensitive material which becomes insoluble in an etchant by light irradiation or a positive photosensitive material which becomes soluble in an etchant by light irradiation can be used for the insulator 1714. For the insulator 1714, without limitation to an organic compound, either an organic compound or an inorganic compound such as silicon oxide or silicon oxynitride can be used.

Over the first electrode layer 1713, an EL layer 1700 including a light-emitting layer and a second electrode layer 1716 are stacked. The first electrode layer 1713 corresponds to the above-described first electrode layer 302, and the second electrode layer 1716 corresponds to the above-described second electrode layer 306. Note that when an ITO film is used as the first electrode layer 1713, and a stacked film of a titanium nitride film and a film containing aluminum as its main component or a stacked film of a titanium nitride film, a film containing aluminum as its main component, and a titanium nitride film is used as the wiring of the current-controlling TFT 1712 connected to the first electrode layer 1713, resistance of the wiring is low and favorable ohmic contact with the ITO film can be obtained. Note that, although not shown here, the second electrode layer 1716 is electrically connected to the FPC 1709 which is an external input terminal.

In the EL layer 1700, at least the light-emitting layer is provided, and in addition to the light-emitting layer, a hole-injecting layer, a hole-transporting layer, an electron-transporting layer, or an electron-injecting layer is provided as appropriate. A light-emitting element 1715 is formed of a stack structure of the first electrode layer 1713, the EL layer 1700, and the second electrode layer 1716.

In addition, although the cross-sectional view of FIG. 14B shows only one light-emitting element 1715, a plurality of light-emitting elements is arranged in matrix in the pixel portion 1702. Light-emitting elements which provide three kinds of light emissions (R, G, B) are selectively formed in the pixel portion 1702, so that a light-emitting device capable of full color display can be formed. Alternatively, by a combination with color filters, a light-emitting device capable of full color display may be formed.

Furthermore, the sealing substrate 1704 and the element substrate 1710 are attached to each other with the sealant 1705, and thus the light-emitting element 1715 is provided in a space 1707 surrounded by the element substrate 1710, the sealing substrate 1704, and the sealant 1705. Note that the space 1707 may be filled with the sealant 1705 or with an inert gas (such as nitrogen or argon).

Note that an epoxy-based resin is preferably used as the sealant 1705. In addition, it is preferable that such a material transmit as little moisture and oxygen as possible. In addition, as the sealing substrate 1704, a plastic substrate formed of fiberglass-reinforced plastics (FRP), polyvinyl fluoride (PVF), polyester, acrylic, or the like can be used instead of a glass substrate or a quartz substrate.

As described above, the light-emitting device can be obtained by application of the present invention. Although an active-matrix light-emitting device tends to require high manufacturing cost per device because TFTs are manufactured, application of the present invention makes it possible to drastically reduce loss of materials in forming light-emitting elements. Thus, cost can be reduced.

In addition, application of the present invention makes it easy to form an EL layer for forming a light-emitting element and to manufacture a light-emitting device including the light-emitting element. Moreover, application of the present invention facilitates patterning of a light-emitting layer; thus, it also facilitates manufacture of a light-emitting device. Further, a fine pattern can be formed; thus, a high-definition light-emitting device can be obtained. Furthermore, application of the present invention makes it possible to use, as a light source, a lamp heater or the like which is inexpensive but provides a large amount of heat can be used instead of a laser device. Accordingly, manufacturing cost of a light-emitting device can be reduced.

Note that this embodiment mode can be combined with any other embodiment mode described in this specification as appropriate.

Embodiment Mode 7

In this embodiment mode, various electronic devices each of which is completed using the light-emitting device manufactured by application of the present invention are described using FIGS. 15A to 15E and FIGS. 16A to 16C.

As examples of electronic devices to which the light-emitting device of the present invention is applied, there are televisions, cameras such as video cameras or digital cameras, goggle type displays (head-mounted displays), navigation systems, audio playback devices (e.g., car audio systems and audio systems), notebook computers, game machines, portable information terminals (e.g., mobile computers, cellular phones, smartphones, portable game machines, and electronic book readers), image playback devices in which a recording medium is provided (devices that are capable of playing back recording media such as digital versatile discs (DVDs) and equipped with a display device that can display an image), and the like. Specific examples of these electronic devices are shown in FIGS. 15A to 15E and FIGS. 16A to 16C.

Figure 15A:
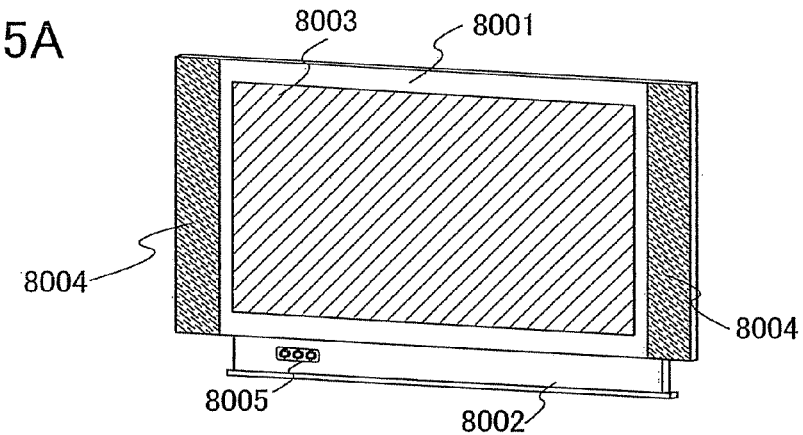
FIGS. 15A to 15E illustrate examples of electronic devices.

FIG. 15A shows a display device, which includes a chassis 8001, a support 8002, a display portion 8003, speaker portions 8004, a video input terminal 8005, and the like. The display device is manufactured by using a light-emitting device formed according to the present invention for the display portion 8003. Note that the display device includes all devices for displaying information, such as for a personal computer, for receiving TV broadcasting, and for displaying an advertisement. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive display device can be provided.

Figure 15B:
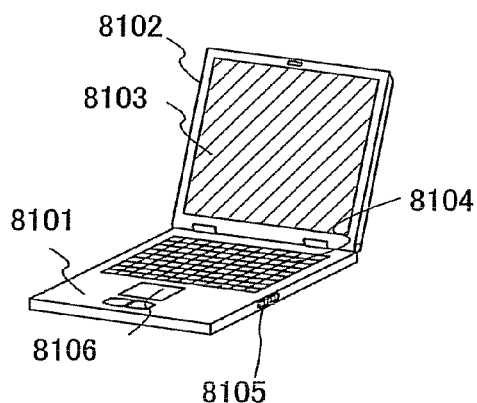

FIG. 15B shows a computer, which includes a main body 8101, a chassis 8102, a display portion 8103, a keyboard 8104, an external connecting port 8105, a pointing device 8106, and the like. The computer is manufactured by using a light-emitting device including a light-emitting element formed using the evaporation donor substrate of the present invention for the display portion 8103. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive computer can be provided.

Figure 15C:
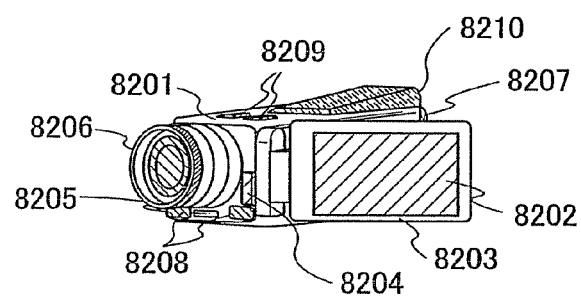

FIG. 15C shows a video camera, which includes a main body 8201, a display portion 8202, a chassis 8203, an external connecting port 8204, a remote control receiving portion 8205, an image receiving portion 8206, a battery 8207, an audio input portion 8208, an operation key 8209, an eye piece portion 8210, and the like. The video camera is manufactured by using a light-emitting device formed according to the present invention for the display portion 8202. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive video camera can be provided.

Figure 15D:
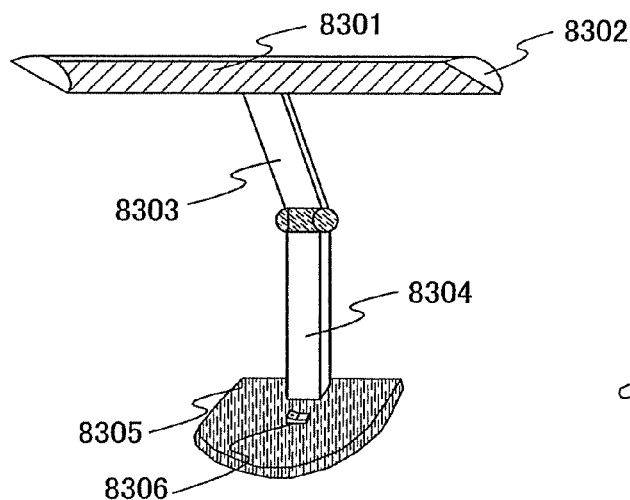

FIG. 15D shows a desk lamp, which includes a lighting portion 8301, a shade 8302, an adjustable arm 8303, a support 8304, a base 8305, and a power supply switch 8306. The desk lamp is manufactured by using a light-emitting device including a light-emitting element formed using the evaporation donor substrate of the present invention for the lighting portion 8301. Note that a lamp includes a ceiling light, a wall light, and the like in its category. Since the precision of patterning in forming a light-emitting layer can be enhanced by application of the present invention, a light-emitting device having excellent characteristics can be manufactured. In addition, since throughput can be improved by application of the present invention, productivity in manufacturing the light-emitting device can be improved. Moreover, since loss of materials in manufacturing the light-emitting device can be reduced, manufacturing cost can be reduced and an inexpensive desk lamp can be provided.

Figure 15E:
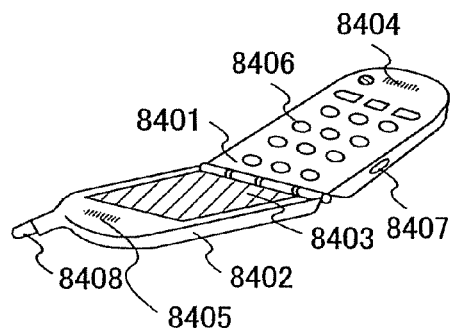

Here, FIG. 15E shows a cellular phone, which includes a main body 8401, a chassis 8402, a display portion 8403, an audio input portion 8404, an audio output portion 8405, an operation key 8406, an external connecting port 8407, an antenna 8408, and the like. The cellular phone is manufactured by using a light-emitting device including a light-emitting element formed using the evaporation donor substrate of the present invention for the lighting portion 8403. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive cellular phone can be provided.

Figure 16A:
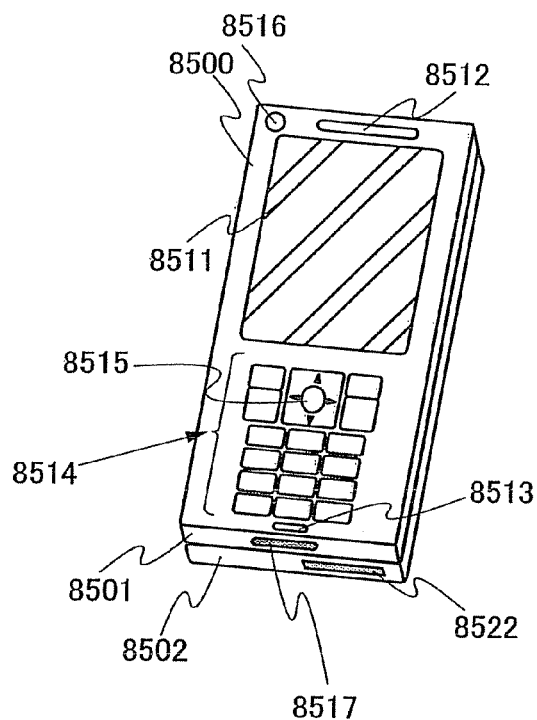
FIGS. 16A to 16C illustrate examples of electronic devices.
Figure 16B:
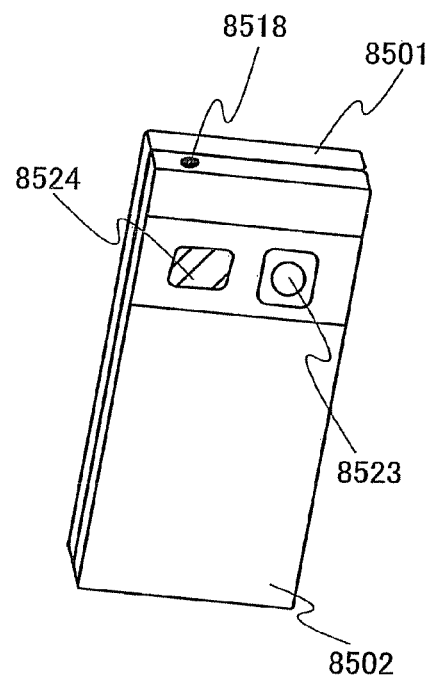
Figure 16C:
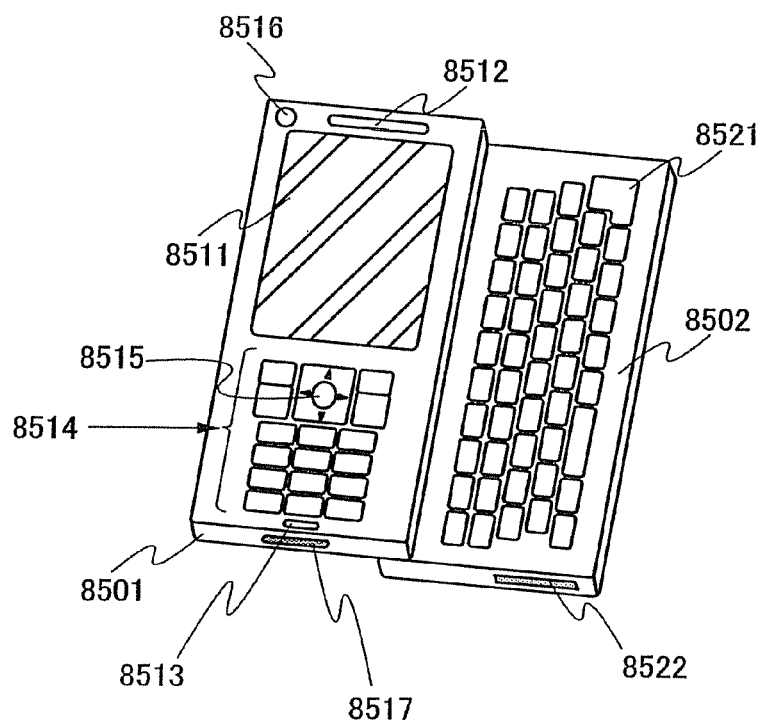

In addition, FIGS. 16A to 16C show a cellular phone 8500 which is another example of a cellular phone according to the present invention. FIG. 16A is a front view, FIG. 16B is a rear view, and FIG. 16C is a development view. The cellular phone 8500 is a so-called smartphone that has both functions of a cellular phone and a portable information terminal and incorporates a computer and can process a variety of data processing in addition to voice calls.

The cellular phone 8500 has two chassis: a chassis 8501 and a chassis 8502. The chassis 8501 includes a display portion 8511, a speaker 8512, a microphone 8513, operation keys 8514, a pointing device 8515, a camera lens 8516, an external connection terminal 8517, and the like. The chassis 8502 includes a keyboard 8521, an external memory slot 8522, a camera lens 8523, a light 8524, an earphone terminal 8518, and the like. In addition, an antenna is incorporated in the chassis 8501. In the cellular phone 8500, a light-emitting device including a light-emitting element manufactured by using the evaporation donor substrate of the present invention is used for the display portion 8511.

Further, in addition to the above-described structure, the smartphone may incorporate a non-contact IC chip, a small size memory device, or the like.

In the display portion 8511, a display orientation can be appropriately changed according to a usage pattern. Because the camera lens 8516 is provided in the same plane as the display portion 8511, the smartphone can be used for videophone calls. Further, a still image and a moving image can be taken with the camera lens 8523 and the light 8524 using the display portion 8511 as a viewfinder. The speaker 8512 and the microphone 8513 can be used for videophone calls, recording and playing sound, etc. without being limited to voice calls. With operation keys 8514, making and receiving calls, inputting simple information such as e-mails, scrolling the screen, moving the cursor, and the like are possible. Furthermore, the chassis 8501 and the chassis 8502, which are overlapped with each other (FIG. 16A), are slid to expose the chassis 8502, as shown in FIG. 16C, and can be used as a portable information terminal. At this time, smooth operation can be conducted using the keyboard 8521 and the pointing device 8515. The external connection terminal 8517 can be connected to an AC adaptor and various types of cables such as a USB cable, and charging, data communication with a personal computer, or the like are possible. Furthermore, a large amount of data can be stored and moved by inserting a recording medium into the external memory slot 8522.

In addition to the above described functions, the smartphone may have an infrared communication function, a television receiver function, and the like.

Since the precision of patterning in forming a light-emitting layer can be enhanced by applying the present invention to the cellular phone 8500, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive cellular phone can be provided.

As described above, an electronic device or a lighting apparatus can be obtained by using the light-emitting device of the present invention. The range of application of the light-emitting device of the present invention is wide, whereby the light-emitting device can be applied to electronic devices of a variety of fields.

Note that this embodiment mode can be appropriately combined with any of the other embodiment modes described in this specification.

Embodiment 1

Figure 17A:
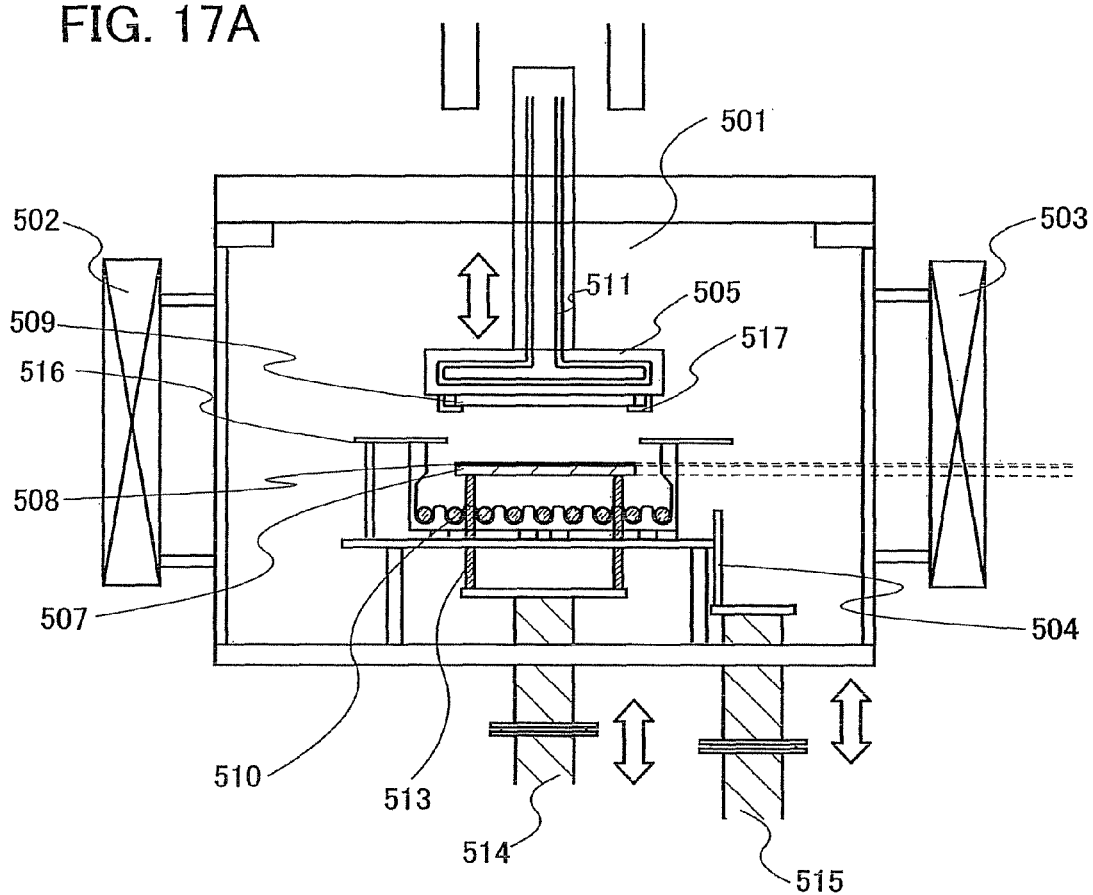
FIGS. 17A and 17B illustrate an example of a deposition apparatus.
Figure 17B:
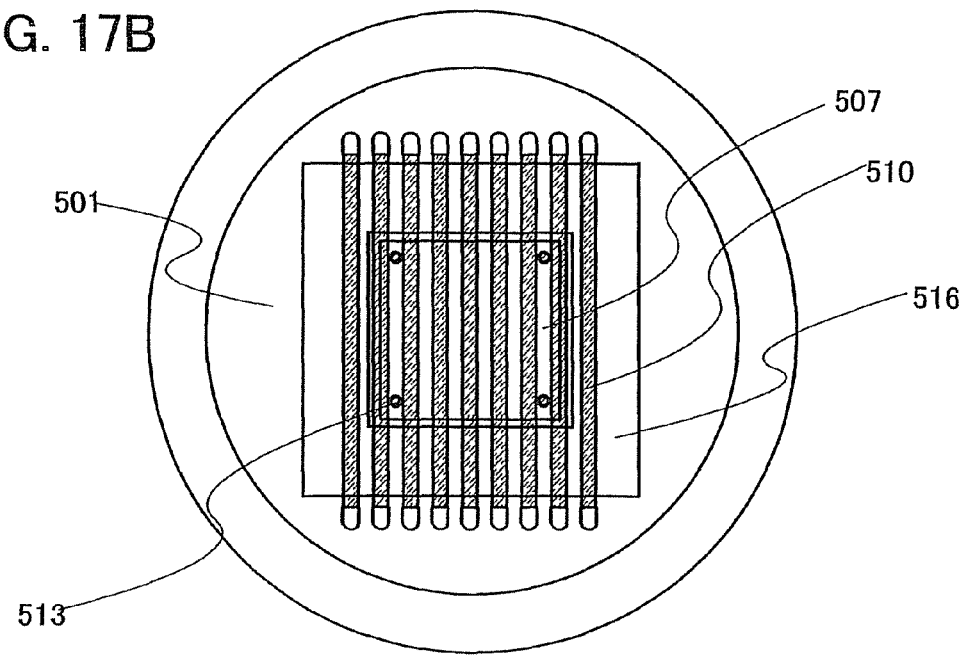
Figure 18:
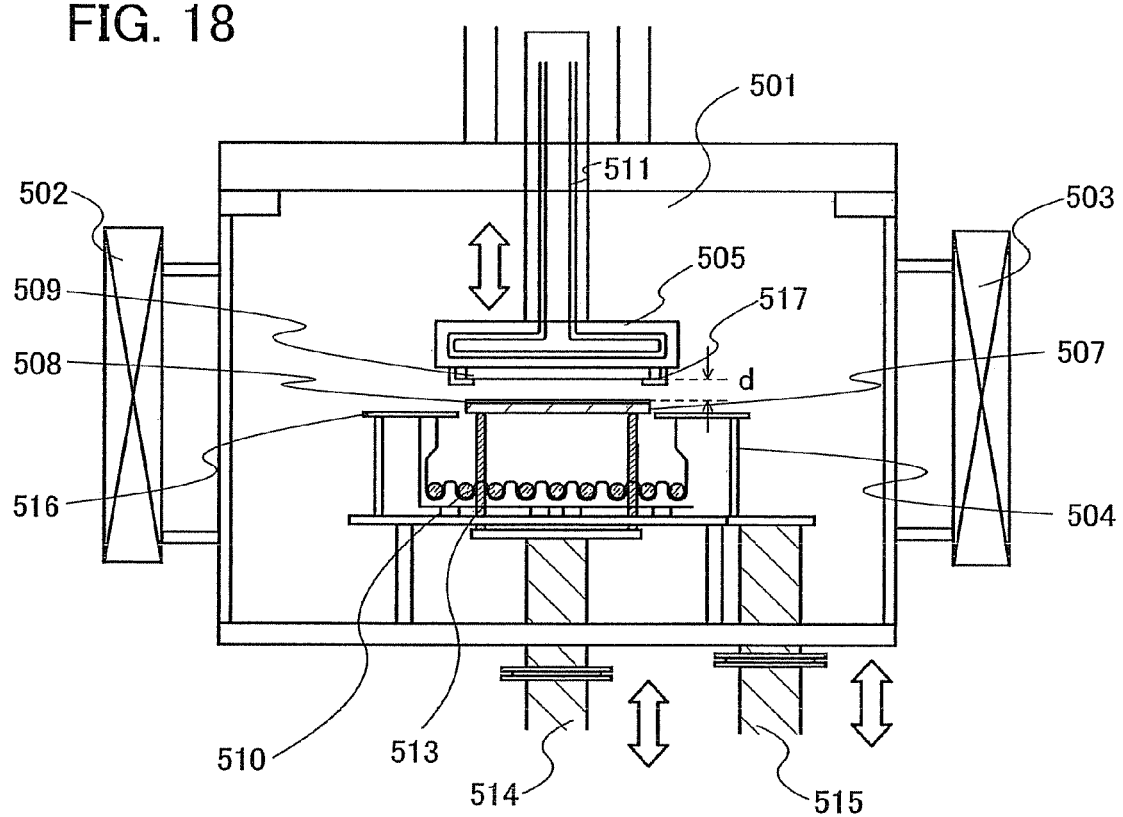
FIG. 18 illustrates an example of a deposition apparatus.

In this embodiment, an example of a deposition apparatus which enables manufacture of the light-emitting device of the present invention is described using FIGS. 17A and 17B and FIG. 18. Note that FIG. 17A is a cross-sectional view of the deposition apparatus, and 17B is a top view of the deposition apparatus.

In FIGS. 17A and 17B, a deposition chamber 501 is a vacuum chamber and is connected to other treatment chambers via a first gate valve 502 and a second gate valve 503. In addition, the deposition chamber 501 includes a substrate supporting mechanism 513 which is a first substrate supporting means, a deposition target substrate supporting mechanism 505 which is a second substrate supporting means, and a halogen lamp 510 as a light source. The halogen lamp is capable of rapid heating, and can also control heating of the first substrate by varying the length of a period in which light is emitted. In addition, since the halogen lamp 510 is capable of rapid heating, a vertical movement mechanism, a shutter, and the like in the case of using a heater can be simplified. Thus, a further reduction in the size of the deposition apparatus can be achieved.

First, in another deposition chamber, a material layer 508 is formed over a first substrate 507 which is a supporting substrate. In this embodiment, a glass substrate where a titanium film is deposited is used as the first substrate 507. Titanium can efficiently absorb light at about 1100 to 1200 nm corresponding to the emission wavelength of a halogen lamp used as the light source; thus, the material layer 508 formed over the titanium film can be efficiently heated. In addition, for the material layer 508, a material which can be evaporated is used. Note that in this embodiment, a substrate which has the same area as the deposition target substrate is used as the first substrate 507. Furthermore, the material layer 508 is formed by a wet method in this embodiment.

As indicated by dotted lines in FIG. 17A, the first substrate 507 is transported to the deposition chamber 501 from the other deposition chamber and is set on the substrate supporting mechanism. At the time of the transport, a reflector shutter 504 is opened with a movable means 515, and the first substrate 507 is set on the substrate supporting mechanism 513 through the opened reflector shutter 504. In addition, the first substrate 507 is fixed to the substrate supporting mechanism 513 so that a surface of the first substrate 507, on which the material layer 508 is formed, faces a deposition target surface of a second substrate 509 which is the deposition target substrate.

Note that the deposition chamber 501 is preferably evacuated to a vacuum. Specifically, the deposition chamber is evacuated to a vacuum of $5 \times 10^{-3}$ Pa or less, preferably from about $10^{-4}$ to $10^{-6}$ Pa. As a vacuum evacuation means which is connected to the deposition chamber, an oil-free dry pump is used to perform vacuum evacuation of from the atmospheric pressure to a pressure on the order of 1 Pa, whereas a magnetic floating turbo molecular pump or a compound molecular pump is used to perform vacuum evacuation of a pressure lower than the above-described range. This prevents contamination by an organic substance, mainly such as oil, from the evacuation means. An inner wall surface is subjected to mirror surface treatment by electrolytic polishing to reduce its surface area, thereby preventing gas discharge.

The second substrate 509 is fixed to the deposition target substrate supporting mechanism 505 with a fixing unit 517. The deposition target substrate supporting mechanism 505 includes a tube 511 through which a heat medium flows. The tube 511 through which a heat medium flows enables the deposition target substrate supporting mechanism 505 to maintain appropriate temperature. For example, cold water may flow through the tube 511 to cool the deposition target substrate or warm water may flow to heat it.

Next, as shown in FIG. 18, the first substrate 507 and the second substrate 509 are disposed close to each other so that the distance therebetween becomes a distance d. Note that the distance d is defined as a distance between a surface of the material layer 508 formed over the first substrate 507 and a surface of the second substrate 509. In addition, in the case where some layer (e.g., a conductive layer which functions as an electrode or an insulating layer which functions as a partition wall) is formed on the second substrate 509, the distance d is defined as a distance between the surface of the material layer 508 over the first substrate 507 and the surface of the layer formed on the second substrate 509. Note that in the case where the surface of the second substrate 509 or the surface of the layer formed on the second substrate 509 is uneven, the distance d is defined as the shortest distance between the surface of the material layer 508 over the first substrate 507 and the outermost surface of the second substrate 509 or the layer formed on the second substrate 509. In this embodiment, the distance d between the substrates is 0.05 mm.

In addition, in the deposition apparatus described in this embodiment, the distance between the substrates is controlled by up-and-down movement of the deposition target substrate supporting mechanism 505 and by up-and-down movement of substrate lift pins, which constitute the substrate supporting mechanism 513, with the first substrate 507 lifted up. The substrate lift pins made of quartz are moved up and down by a movable means 514 to lift up the first substrate 507.

Note that, in this embodiment, in order to reduce influence that heat from the light source on standby has on the material layer 508 over the supporting substrate, the distance between the first substrate 507 (supporting substrate) and the halogen lamp 510 which is the light source is set to be 50 mm on standby (before an evaporation process).

Heat treatment is performed using the halogen lamp 510 while the distance between the substrates is retained at the distance d. First, for preheating, an output of the halogen lamp 510 is maintained at a temperature of 60° C. for 15 seconds. The preheating stabilizes the output of the halogen lamp 510. After that, heat treatment is performed. In the heat treatment, a temperature of 500 to 800° C. is maintained for about 7 to 15 seconds. Because the length of time needed for the heat treatment varies depending on an evaporation material, the length is appropriately set. Note that a reflector 516 and the reflector shutter 504 are provided so that the whole deposition chamber is not heated due to scattering of light from the halogen lamp 510.

By absorbing light from the halogen lamp 510, the titanium film formed over the first substrate 507 is heated; accordingly, the material layer 508 over the titanium film is heated to be sublimed, and thus the evaporation material is deposited onto a deposition target surface (i.e., a lower surface) of the second substrate 509, which is placed so as to face the surface of the material layer 508. In the case of using the deposition apparatus shown in FIGS. 17A and 17B and FIG. 18, if the material layer 508 with a uniform thickness is formed over the first substrate 507 in advance, deposition of a film with high uniformity in thickness can be performed onto the second substrate without using a thickness monitor. In addition, although a substrate is rotated in a conventional evaporation apparatus, the deposition target substrate is fixed during deposition in the deposition apparatus shown in FIGS. 17A and 17B and FIG. 18; thus, this deposition apparatus is suitable for deposition to a large-area glass substrate that is easily broken. In addition, in the deposition apparatus in FIGS. 17A and 17B and FIG. 18, the supporting substrate is also stopped during deposition.

The use of the deposition apparatus of this embodiment makes it possible to manufacture the light-emitting device of the present invention. According to the present invention, an evaporation source can be easily prepared by a wet method. In addition, because the evaporation source is evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be made easier.

Embodiment 2

In this embodiment, an example of an EL layer formed using the evaporation donor substrate of the present invention is described.

Figure 19A:
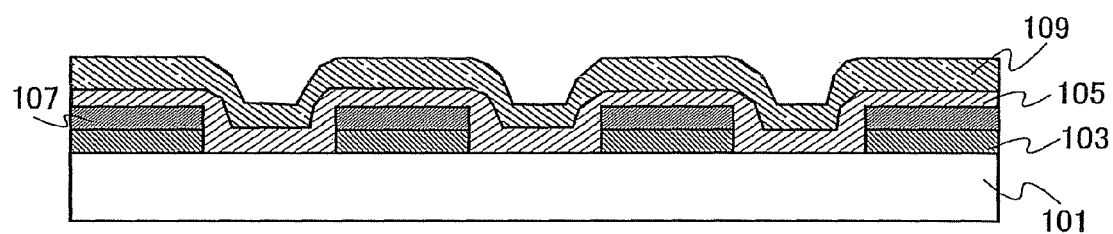
FIGS. 19A and 19B are schematic views each illustrating a cross section in a deposition process according to an aspect of the present invention.

FIG. 19A shows an evaporation donor substrate used in this embodiment. For the evaporation donor substrate of this embodiment, a glass substrate is used as the first substrate 101. In addition, an aluminum film with a thickness of 300 nm is formed as the reflective layer 103, and a titanium oxide film with a thickness of 200 nm is formed as the heat insulating layer 107. Note that the reflective layer 103 and the heat insulating layer 107 include a 3 mm by 9 mm opening portion. Over the heat insulating layer 107, a titanium film with a thickness of 200 nm, which serves as the light absorption layer 105, is formed so as to cover the entire surface of the first substrate 101. In addition, over the light absorption layer 105, NPB is deposited to a thickness of 50 nm as the material layer 109.

Figure 19B:
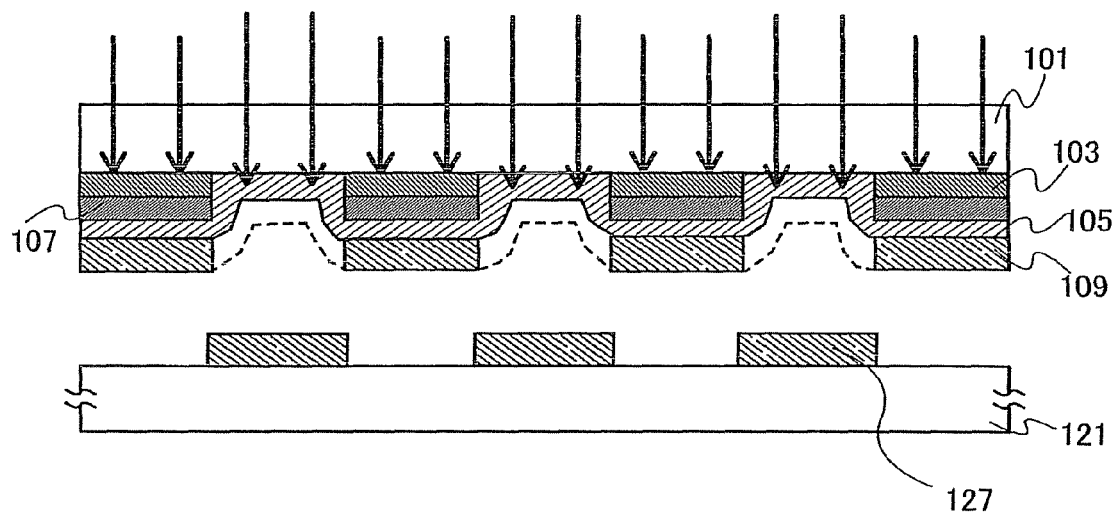

Next, as shown in FIG. 19B, a surface of the first substrate 101, on which the material layer 109 is formed, is disposed to face a second substrate 121 which is a deposition target substrate. A distance d between the first substrate 101 and the deposition target substrate is set to be 50 μm.

Next, by irradiation with infrared light from the rear surface of the first substrate using a lamp heater, an EL layer 127 is formed over the second substrate 121. Irradiation time is set to be seven seconds.

In the evaporation donor substrate of the present invention, provision of the heat insulating layer 107 in a region overlapped with the reflective layer 103 can suppress an increase in sublimation region (a region from which the evaporation material is sublimed) of the material layer 109, which is caused by heat conducted in the plane direction of the light absorption layer 105. In this embodiment, the opening portion of the reflective layer 103 and the heat insulating layer 107 which are provided to the evaporation donor substrate is 3 mm by 9 mm, whereas the sublimation region in the material layer 109 is also 3 mm by 9 mm and the EL layer formed over the deposition target substrate is 4 mm by 12 mm.

Figure 20A:
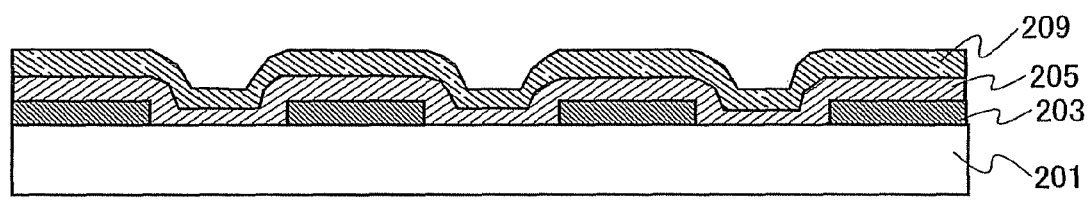
FIGS. 20A and 20B are schematic views each illustrating a cross section in a comparative example of a deposition process.

In addition, for comparison, an EL layer is formed over a deposition target substrate by using an evaporation donor substrate without the heat insulating layer, as shown in FIG. 20A. For the evaporation donor substrate shown in FIG.

20A, as a reflective layer 203, an aluminum film with a thickness of 300 nm is formed over a glass substrate which is used as a first substrate 201. The reflective layer 203 includes a 3 mm by 9 mm opening portion. Over the reflective layer 203, a titanium film with a thickness of 200 nm is formed as a light absorption layer 205. Over the light absorption layer 205, NPB is deposited to a thickness of 50 nm as a material layer 209.

Figure 20B:
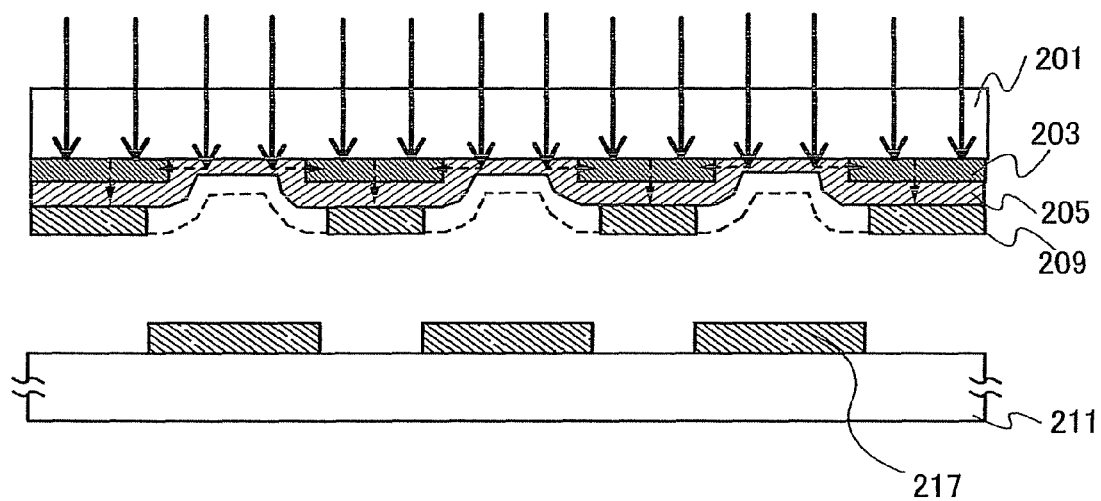

Next, as shown in FIG. 20B, a surface of the first substrate 201, on which the material layer 209 is formed, is disposed to face a second substrate 211 which is the deposition target substrate. The distance d between the first substrate 201 and the deposition target substrate is set to be 50 µm.

Next, by irradiation of infrared light from the rear surface of the first substrate using the lamp heater, an EL layer 217 is formed over the second substrate 211. Irradiation time is set to be seven seconds.

In FIG. 20B, light which has passed through the opening portion in the reflective layer 203 is absorbed in the light absorption layer 205 to be converted to heat. The heat converted in the light absorption layer 205 is conducted in the thickness direction of the light absorption layer 205 to heat a portion of the material layer 209 in the region overlapped with the opening portion, and conducted in the plane direction of the light absorption layer 205 to heat the reflective layer 203. This increases the sublimation region in the material layer 209. Note that in FIG. 20B, the dotted arrows indicate the direction of heat conduction in the light absorption layer 205. In the case of using the evaporation donor substrate of a comparative example having a structure which is described in FIG. 20A, the opening portion of the reflective layer provided to the evaporation donor substrate is 3 mm by 9 mm, whereas the sublimation region in the material layer is 6 mm by 10 mm and the EL layer formed over the deposition target substrate has greater than or equal to a size of 8 mm by 16 mm.

Accordingly, it is shown that by forming the EL layer with the use of the evaporation donor substrate of the present invention, the EL layer can be patterned with high precision, since the heat insulating layer can suppress an increase in sublimation region, which is caused by heat conducted in the plane direction of the light absorption layer.

This application is based on Japanese Patent Application serial no. 2007-275066 filed with Japan Patent Office on Oct. 23, 2007, the entire contents of which are hereby incorporated by reference.

What is claimed is:

1. A method of manufacturing a light-emitting device, comprising the steps of:
    disposing a second substrate and a first substrate which includes a reflective layer including an opening portion, a light absorption layer covering the opening portion of the reflective layer over the reflective layer, a heat insulating layer including an opening portion in a position overlapped with the opening portion of the reflective layer over the light absorption layer, and a material layer including a light-emitting material covering the opening portion of the heat insulating layer over the heat insulating layer, so that one surface of the first substrate faces a deposition target surface of the second substrate; and
    forming an EL layer including the light-emitting material in a region overlapped with the opening portion of the reflective layer and the opening portion of the heat insulating layer on the deposition target surface of the second substrate by performing light irradiation from the other surface side of the first substrate.

2. The method of manufacturing a light-emitting device according to claim 1, wherein the heat insulating layer is formed of a material having lower heat conductivity than the light absorption layer and the reflective layer.

3. The method of manufacturing a light-emitting device according to claim 1, wherein a thickness of the heat insulating layer is greater than or equal to 10 nm and less than or equal to 2 µm.

4. The method of manufacturing a light-emitting device according to claim 1, wherein the light absorption layer is formed in an island shape.

5. The method of manufacturing a light-emitting device according to claim 1, wherein a thickness of the light absorption layer is greater than or equal to 100 nm and less than or equal to 600 nm.

6. The method of manufacturing a light-emitting device according to claim 1, wherein the reflective layer is formed of a material having a reflectance greater than or equal to 85% for light with which the first substrate is irradiated.

7. The method of manufacturing a light-emitting device according to claim 1, wherein the light absorption layer is formed of a material having a reflectance less than or equal to 70% for light with which the first substrate is irradiated.

8. The method of manufacturing a light-emitting device according to claim 1, wherein the material layer contains an organic compound.

9. The method of manufacturing a light-emitting device according to claim 1, wherein the material layer contains a carrier-transporting material.

10. The method of manufacturing a light-emitting device according to claim 1,
    wherein the deposition target surface of the second substrate is provided with a first electrode, and
    wherein after the material layer of the first substrate is sublimed to be evaporated onto the first electrode of the second substrate, a second electrode is formed.

11. A method of manufacturing a light-emitting device, comprising the steps of:
    forming a reflective layer including an opening portion over a first substrate;
    forming a light absorption layer covering the opening portion of the reflective layer over the reflective layer;
    forming a heat insulating layer including an opening portion in a position overlapped with the opening portion of the reflective layer over the light absorption layer;
    forming a material layer including a light-emitting material covering the opening portion of the heat insulating layer over the heat insulating layer;
    disposing the first substrate and a second substrate so that one surface of the first substrate faces a deposition target surface of the second substrate; and
    forming an EL layer including the light-emitting material in a region overlapped with the opening portion of the reflective layer and the opening portion of the heat insulating layer on the deposition target surface of the second substrate by performing light irradiation from the other surface side of the first substrate.

12. The method of manufacturing a light-emitting device according to claim 11, wherein the heat insulating layer is formed of a material having lower heat conductivity than the light absorption layer and the reflective layer.

13. The method of manufacturing a light-emitting device according to claim 11, wherein a thickness of the heat insulating layer is greater than or equal to 10 nm and less than or equal to 2 µm.

14. The method of manufacturing a light-emitting device according to claim 11, wherein the light absorption layer is formed in an island shape.

15. The method of manufacturing a light-emitting device according to claim 11, wherein a thickness of the light absorption layer is greater than or equal to 100 nm and less than or equal to 600 nm.

16. The method of manufacturing a light-emitting device according to claim 11, wherein the reflective layer is formed of a material having a reflectance greater than or equal to 85% for light with which the first substrate is irradiated.

17. The method of manufacturing a light-emitting device according to claim 11, wherein the light absorption layer is formed of a material having a reflectance less than or equal to 70% for light with which the first substrate is irradiated.

18. The method of manufacturing a light-emitting device according to claim 11, wherein the material layer contains an organic compound.

19. The method of manufacturing a light-emitting device according to claim 11, wherein the material layer contains a carrier-transporting material.

20. The method of manufacturing a light-emitting device according to claim 11,
wherein the deposition target surface of the second substrate is provided with a first electrode, and
wherein after the material layer of the first substrate is sublimed to be evaporated onto the first electrode of the second substrate, a second electrode is formed.

21. A method of manufacturing a light-emitting device, comprising the steps of:
preparing a first substrate which comprises;
a reflective layer including an opening portion over the first substrate;
a light absorption layer covering the opening portion of the reflective layer over the reflective layer;
a heat insulating layer including an opening portion in a position overlapped with the opening portion of the reflective layer over the light absorption layer; and
a material layer covering the opening portion of the heat insulating layer over the heat insulating layer;
disposing the first substrate and a second substrate so that one surface of the first substrate faces a deposition target surface of the second substrate; and
forming first a layer in a region overlapped with the opening portion of the reflective layer and the opening portion of the heat insulating layer on the deposition target surface of the second substrate by performing light irradiation from the other surface side of the first substrate.

22. The method of manufacturing a light-emitting device according to claim 21, wherein the heat insulating layer is formed of a material having lower heat conductivity than the light absorption layer and the reflective layer.

23. The method of manufacturing a light-emitting device according to claim 21, wherein a thickness of the heat insulating layer is greater than or equal to 10 nm and less than or equal to 2 µm.

24. The method of manufacturing a light-emitting device according to claim 21, wherein the light absorption layer is formed in an island shape.

25. The method of manufacturing a light-emitting device according to claim 21, wherein a thickness of the light absorption layer is greater than or equal to 100 nm and less than or equal to 600 nm.

26. The method of manufacturing a light-emitting device according to claim 21, wherein the reflective layer is formed of a material having a reflectance greater than or equal to 85% for light with which the first substrate is irradiated.

27. The method of manufacturing a light-emitting device according to claim 21, wherein the light absorption layer is formed of a material having a reflectance less than or equal to 70% for light with which the first substrate is irradiated.

28. The method of manufacturing a light-emitting device according to claim 21, wherein the material layer contains an organic compound.

29. The method of manufacturing a light-emitting device according to claim 21, wherein the material layer contains a carrier-transporting material.

30. The method of manufacturing a light-emitting device according to claim 21,
wherein the deposition target surface of the second substrate is provided with a first electrode, and
wherein after the material layer of the first substrate is sublimed to be evaporated onto the first electrode of the second substrate, a second electrode is formed.

31. The method of manufacturing a light-emitting device according to claim 21, wherein the material layer includes a light-emitting material, and wherein the first layer is an EL layer including light-emitting material.

* * * * *

UNITED STATES PATENT AND TRADEMARK OFFICE
CERTIFICATE OF CORRECTION

PATENT NO. : 9,444,051 B2  
APPLICATION NO. : 13/442133  
DATED : September 13, 2016  
INVENTOR(S) : Tomoya Aoyama et al.

It is certified that error appears in the above-identified patent and that said Letters Patent is hereby corrected as shown below:

In the Specification

Column 1, Line 48; Change "Miming" to --forming--.

Column 14, Line 12; Change "1 μM" to --1 μm--.

Column 18, Line 55; Change "fainted" to --formed--.

Column 20, Line 11; Change "although. FIG." to --although FIG.--.

Column 27, Line 35; Change "Mimed" to --formed--.

Column 28, Line 15; Change "[4,5-m]" to --[4,5-α]--.

Column 28, Line 41; Change "2PCABPbA" to --2PCABPhA--.

Column 29, Line 29; Change "faulting" to --forming--.

Column 31, Line 29; Change "N,N-" to --N,N'- --.

Column 33, Line 2; Change "BAIq" to --BAlq--.

Column 34, Line 49; Change "polyimide, polyimide" to --polyamide, polyimide--.

Column 35, Line 9; Change "1515G and" to --1515G, and--.

In the Claims

Column 47, Line 44, Claim 21; Change "forming first a layer" to --forming a first layer--.

Signed and Sealed this  
Eleventh Day of April, 2017

Michelle K. Lee  
*Director of the United States Patent and Trademark Office*